(12) United States Patent
Nielsen

(10) Patent No.: US 12,119,824 B2
(45) Date of Patent: Oct. 15, 2024

(54) DELAY CELL CIRCUITS

(71) Applicant: Nordic Semiconductor ASA, Trondheim (NO)

(72) Inventor: Cole Nielsen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 57 days.

(21) Appl. No.: 17/924,315

(22) PCT Filed: May 11, 2021

(86) PCT No.: PCT/EP2021/062528
§ 371 (c)(1),
(2) Date: Nov. 9, 2022

(87) PCT Pub. No.: WO2021/228889
PCT Pub. Date: Nov. 18, 2021

(65) Prior Publication Data
US 2023/0179184 A1 Jun. 8, 2023

(30) Foreign Application Priority Data
May 11, 2020 (GB) ..................... 2006884

(51) Int. Cl.
*H03K 3/03* (2006.01)
*H03K 5/134* (2014.01)
(52) U.S. Cl.
CPC ......... *H03K 3/0322* (2013.01); *H03K 5/134* (2014.07)

(58) Field of Classification Search
CPC ..... H03K 19/0027; H03K 2005/00032; H03K 2217/0018; H03K 5/134; H03K 3/0322;
(Continued)

(56) References Cited

U.S. PATENT DOCUMENTS 6,133,799 A 10/2000 Favors, Jr. et al.
6,404,243 B1 6/2002 Koch, II et al.
(Continued)

OTHER PUBLICATIONS

IPO Search Report under Section 17(5) for GB2006884.7, mailed Jul. 1, 2020, 3 pages.
(Continued)

*Primary Examiner* — Ryan Johnson
(74) *Attorney, Agent, or Firm* — Klarquist Sparkman, LLP

(57) ABSTRACT

A time delay circuit comprising a plurality of differential delay cells each having a respective time delay and being arranged in series. Each delay cell comprises first and second inverter sub-cells, each comprising a respective PMOS transistor and an NMOS transistor arranged in series such that their respective drain terminals are connected at a drain node. Each of the transistors has a back-gate terminal and is arranged such that a respective voltage applied to said back-gate terminal linearly controls its respective threshold voltage. The back-gate terminal of the PMOS transistor in each inverter sub-cell is connected to the drain node of the other sub-cell and/or the back-gate terminal of the NMOS transistor in each inverter sub-cell is connected to the drain node of the other sub-cell. A control signal varies the time delay of the delay cell by adjusting a voltage supplied to a back-gate terminal of a transistor.

7 Claims, 15 Drawing Sheets

(58) Field of Classification Search
CPC ........ H03K 3/0315; H03K 2005/00208; H03L 7/0995
See application file for complete search history.

(56) References Cited

U.S. PATENT DOCUMENTS

2015/0280716 A1    10/2015  Vashishtha et al.
2016/0028410 A1*   1/2016   Lim ..................... H03L 7/0818
                                                          327/158
2016/0301365 A1    10/2016  Jacquemod et al.

OTHER PUBLICATIONS

International Search Report and Written Opinion for PCT/EP2021/062528, mailed Aug. 23, 2021, 14 pages.
Jacquemod et al., "New design of analog and mixed-signal cells using back-gate cross-coupled structure," *2019 IFIP/IEEE 27th International Conference on Very Large Scale Integration*, Oct. 2019, pp. 21-26.

* cited by examiner $G_m = g_{mn} + g_{mp}$
$G_{mb} = g_{mn} + g_{mp}$
$R_o = r_{on} + r_{op}$

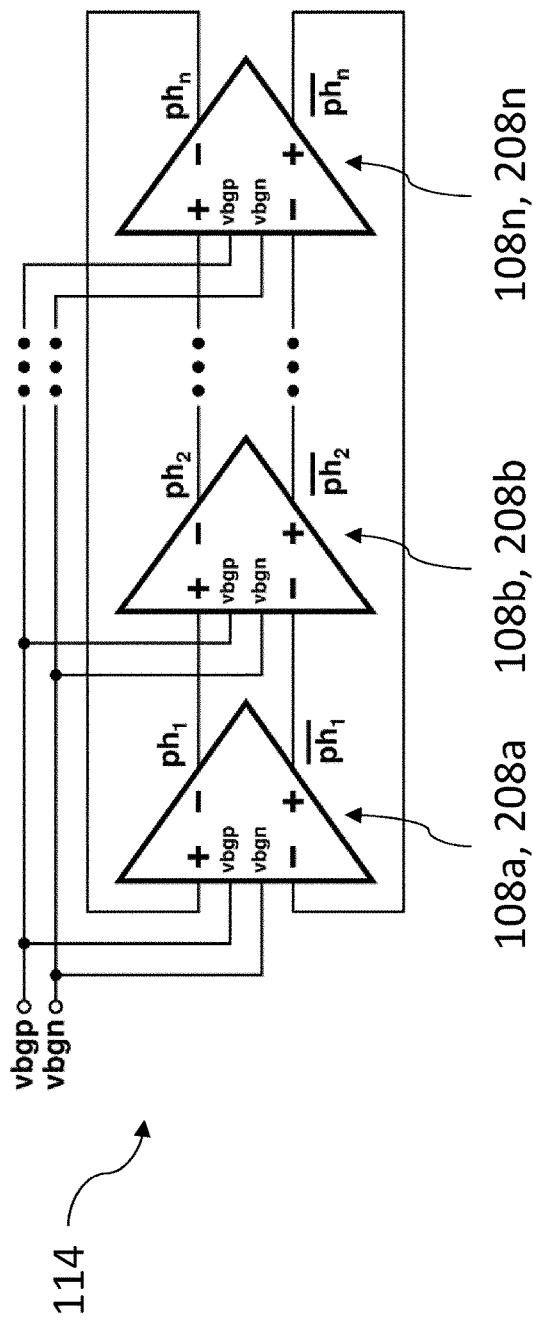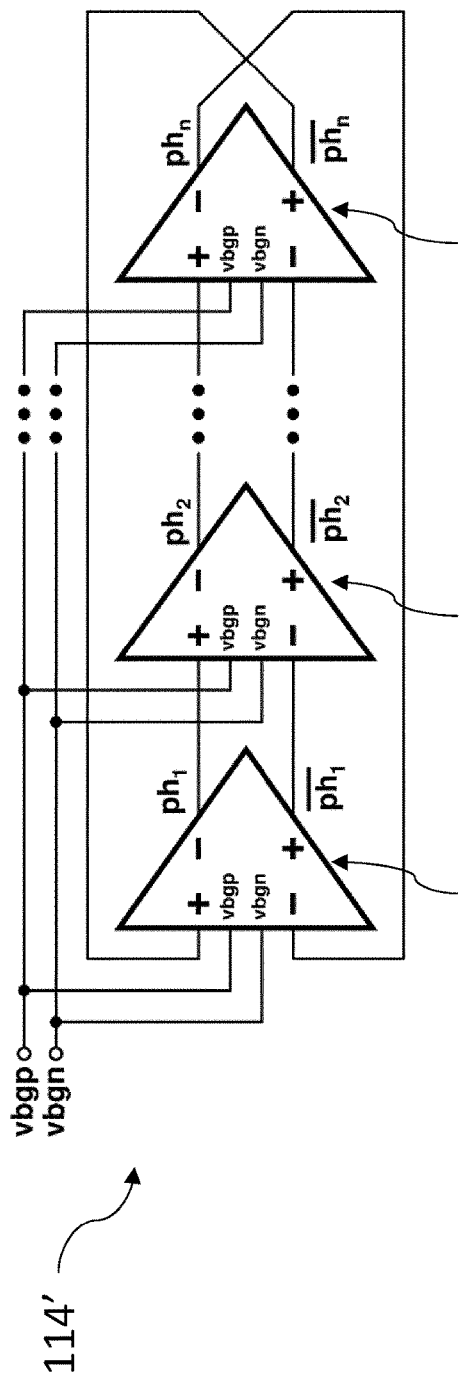

DELAY CELL CIRCUITS

CROSS REFERENCE TO RELATED APPLICATIONS

This is the U.S. National Stage of International Application No. PCT/EP2021/062528, filed May 11, 2021, which was published in English under PCT Article 21(2), which in turn claims the benefit of Great Britain Application No. 2006884.7, filed May 11, 2020.

TECHNICAL FIELD

The present invention relates to delay cell circuits, in particular to pseudo-differential delay circuits utilising ultra-thin body and buried oxide (UTBB) fully depleted silicon-on-insulator (FDSOI) devices, where the delay circuits are particularly suited for use in oscillators such as ring oscillators.

BACKGROUND

In many applications, known in the art per se, delay cell circuits are a key component used to impart a time delay between when a signal enters the input of the delay cell and when that signal (or a signal derived from the input signal) is then provided at the output of the delay cell. Generally, an inverter may be used as a delay cell, where the output is the logical inverse of the input, where the inverter exhibits a finite, non-zero propagation delay between its input and output. These delay cells may be used to create 'delay lines', in a manner known in the art per se.

A further common application of delay cells, and in particular inverters, is in ring oscillators, a type of time delay oscillator. Those skilled in the art will appreciate that a single-ended ring oscillator is typically constructed from an odd number of inverters 'daisy-chained' together in a loop, where the output of each inverter is connected to the input of the next inverter in the loop, in series. Due to the propagation delay and the odd number of inverters, an output signal taken from a point on the loop is a stable square-wave signal. A differential ring oscillator may be constructed using an odd or even number of differential inverters connected in a loop, where the inverting output of one inverter is connected to the non-inverting input of the next inverter, and the non-inverting output of the former is connected to the inverting input of the latter, where these connections provide the instability that leads to oscillatory behaviour.

The frequency of the ring oscillator depends on a couple of factors. Firstly, each inverter in the loop contributes to the delay of the signal around the ring, such that each additional pair of inverters (where pairs are required to keep the total number of inverters odd) to the ring adds to the total delay, which decreases the oscillator frequency. Secondly, the supply voltage also influences the delay through each of the inverters, where higher supply voltages typically lead to a reduction in the delay, thereby increasing the frequency.

The Applicant has appreciated, however, that it would be beneficial to provide finer control over the delay exhibited by a delay cell, for example in order to control the oscillation frequency of time delay oscillator circuits such as ring oscillators.

Moreover, the Applicant has also appreciated that differential behaviour of the delay cell is advantageous in order to provide for a differential oscillator circuit, such as a differential ring oscillator.

SUMMARY OF THE INVENTION

When viewed from a first aspect, the present invention provides a time delay circuit comprising a plurality of differential delay cells each having a respective time delay and being arranged in series, wherein each delay cell comprises:

first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;

wherein the back-gate terminal of the PMOS transistor in each inverter sub-cell is connected to the drain node of the other sub-cell and/or the back-gate terminal of the NMOS transistor in each inverter sub-cell is connected to the drain node of the other sub-cell; and wherein a control signal varies the time delay of the delay cell by adjusting a voltage supplied to a back-gate terminal of at least one transistor.

This first aspect extends to a differential delay cell having a time delay, said delay cell comprising:

first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;

wherein the back-gate terminal of the PMOS transistor in each inverter sub-cell is connected to the drain node of the other sub-cell and/or the back-gate terminal of the NMOS transistor in each inverter sub-cell is connected to the drain node of the other sub-cell; and wherein a control signal varies the time delay of the delay cell by adjusting a voltage supplied to a back-gate terminal of at least one transistor.

Thus it will be appreciated by those skilled in the art that embodiments of the present invention provide an improved time delay circuit where the time delay can be controlled through a voltage applied to the back-gate of a suitable transistor. Such suitable transistors provide linear control over the threshold voltage of the transistor by exploiting the body effect of MOS transistors through these back-gate terminals' (sometimes referred to as 'body contacts'. Preferably, the transistor technology provides the capability to bias both PMOS and NMOS back-gate terminals across an overlapping range, covering 0 V to the design supply voltage, while avoiding any forward biasing of any well, substrate, drain, or source diodes, which may be harmful. It is also preferable that the transistor technology provides the ability to form electrically isolated and unique back-gate terminals for all PMOS and NMOS devices.

In at least some embodiments, the transistors comprise ultra-thin body and buried oxide (UTBB) fully depleted silicon-on-insulator (or UTBB-FDSOI) transistors. Those skilled in the art will appreciate that so-called UTBB-FDSOI devices are a recent development in semiconductor devices, and have a 'back-gate' terminal, where a control (or 'bias')

voltage applied to that back-gate terminal modulates provides a high level of fine control over the threshold voltage of the transistor.

Unlike conventional bulk complementary metal-oxide-semiconductor (CMOS) technology in which devices are manufactured from silicon substrates, 'silicon-on-insulator' (SOI) devices are manufactured from layers of silicon stacked on an insulating layer, typically silicon dioxide or sapphire. SOI devices can be manufactured through 'partial depletion' (PDSOI) or 'full depletion' (FDSOI), where 'partial' and 'full' refer to the degree to which the depletion region extends through the bulk of the device. SOI enables the usage of transistor back bias and which may provide for a reduction in transistor leakage or make transistors faster, depending on the type of back bias in use. A forward back bias may lead to faster transistors (but that leak more) whereas a reverse back bias may lead to transistors leaking less (but that are slower).

The Applicant has appreciated that the advantageous arrangement for a time delay circuit disclosed herein has a number of benefits.

Firstly, due to the nature of the body effect in transistors having the properties described hereinabove, and in particular UTBB-FDSOI transistors, the time delay of each differential delay cell is inversely proportional to the voltage at the back-gate terminal of the transistor. This makes control of the propagation delay of each cell significantly more simple than is the case with conventional arrangements, reducing the complexity of the control over circuits using such delay cells, such as delay lines and ring oscillators, as outlined in further detail below. Advantageously, the frequency (i.e. the inverse of the time delay) of the delay cell is linear with the applied voltage at the back-gate terminal of the transistor, and thus when used in applications such as ring oscillators, linear control of the ring oscillator frequency may be achieved.

The Applicant has appreciated that embodiments of the present invention may advantageously allow for a rail-to-rail input range. This wide range, coupled with the aforementioned linearity, permits improved performance and implementation simplicity, e.g. when connected to a digital-to-analogue converter (DAC) or placed in a phase-locked loop (PLL).

Additionally, with the use of such transistors, the relatively high impedance of the control nodes may allow for a significantly shorter response time of the delay cell to changes in the control signal than with conventional time delay cells, and in some cases the response time may be near-instantaneous.

A time delay circuit in accordance with embodiments of the present invention provides for very low circuit complexity, requiring no biasing currents or reference voltages and/or currents. The connections between the back-gate terminals in each inverter sub-cell to the drain node in the other inverter sub-cell provides 'cross-coupling' between the inverter sub-cells. This cross-coupling provides pseudo-differential behaviour without the need for bias current.

Furthermore, due to the direct, voltage-based control, no current starvation is required in order to provide this control over the time delay of the delay cell.

Removing the need for biasing and current starvation may advantageously reduce the noise and overall power consumption of the time delay circuit when compared to conventional time delay circuits that are known in the art per se. In addition, the output of each delay cell, and thus the time delay circuit, may swing across the full rail-to-rail range. Those skilled in the art will appreciate that the term 'rail-to-rail' as used herein means that the voltage may take values across the full range between the positive and negative supply voltages, which may be the positive and negative supply voltages supplied to some or all of the time delay circuit. The positive supply voltage may be a positive voltage while the negative supply voltage may be ground, though other arrangements are possible, and may be chosen as appropriate for the transistor(s).

Generally, the control signal may be presented with relatively high impedance, in other words a control terminal to which the control signal is applied is a high impedance terminal, i.e. it does not draw any significant current. This may make generating the voltage at the back-gate terminal of the transistor(s) possible with very low power, and for example may, at least in some embodiments, allow generation of the control signal with a DAC, e.g. operating with no buffer and that may use the supply rails as reference levels. This may yield a relatively high dynamic range of control signal versus noise and/or allow for simplified DAC design, for example a lower power DAC design.

The time delay circuit may be a delay line circuit. Those skilled in the art will appreciate that a delay line circuit is a chain of delay cells, arranged in series, designed to introduce a propagation delay between when a signal is applied at its input and when that signal is produced at the output of the delay line.

However, in an alternative set of embodiments, the time delay circuit comprises a ring oscillator circuit comprising a plurality of differential delay cells arranged in a ring, each having a positive input, a negative input, a positive output, and a negative output, wherein the positive output of each differential delay cell is connected to the negative input of the next differential delay cell in the ring. Due to the linear control over the time delays of the cells as outlined above, the oscillation frequency of such a ring oscillator is highly linear with control voltage, i.e. due to the nature of the body effect in transistor technology such as UTBB-FDSOI transistors.

This is novel and inventive in its own right and thus, when viewed from a second aspect, the present invention provides a ring oscillator circuit comprising:

a plurality of differential delay cells arranged in a ring, each having a differential output connected to a differential input of the next differential delay cell in the ring;

wherein each differential delay cell comprises first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such a respective threshold voltage of said transistor is linearly dependent on a respective voltage applied to the back-gate terminal of said transistor;

wherein the back-gate terminal of the PMOS transistor in each inverter sub-cell is connected to the drain node of the other sub-cell and/or the back-gate terminal of the NMOS transistor in each inverter sub-cell is connected to the drain node of the other sub-cell; and wherein a control signal varies the time delay of the delay cell by adjusting a voltage supplied to a back-gate terminal of at least one transistor.

In some embodiments of the second aspect of the invention, each of the PMOS and NMOS transistors comprises a UTBB-FDSOI transistor.

In some embodiments, the voltage applied to the back-gate terminal to control the time delay of the delay cell may be a rail-to-rail voltage. The linearity of the time delay, and thus the frequency of a ring oscillator, may advantageously be retained across the full range of the control voltage. In a ring oscillator, full rail-to-rail operation may generally lead to lower phase noise, which is beneficial in many applications.

As outlined above, the inverter sub-cells are cross-coupled such that the back-gate terminals of the PMOS transistors and/or the NMOS transistors in one inverter sub-cell are connected to the drain node in the other sub-cell, i.e. either one or both of the transistor types may be cross-coupled. In some embodiments, only one of the transistor types is cross-coupled (i.e. either the PMOS or the NMOS, but not both) while the other transistors of the other type have their respective back-gate terminals supplied with the control voltage. In other words, the transistors of one type provide the pseudo-differential behaviour while the transistors of the other type provide for control of the time delay/frequency of the time delay circuit.

This 'asymmetric' arrangement is novel and inventive in its own right and thus, when viewed from a third aspect, the present invention provides a time delay circuit comprising a plurality of differential delay cells each having a respective time delay and being arranged in series, wherein each delay cell comprises:
    first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
    wherein the back-gate terminal of the PMOS transistor in each inverter sub-cell is connected to the drain node of the other sub-cell; and
    wherein a control signal varies the time delay of the delay cell by adjusting a voltage supplied to the back-gate terminal of the NMOS transistor in each inverter sub-cell.

This third aspect of the invention extends to a ring oscillator circuit comprising:
    a plurality of differential delay cells arranged in a ring, each having a differential output connected to a differential input of the next differential delay cell in the ring;
    wherein each differential delay cell comprises first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
    wherein the back-gate terminal of the PMOS transistor in each inverter sub-cell is connected to the drain node of the other sub-cell; and
    wherein a control signal varies the time delay of the delay cell by adjusting a voltage supplied to the back-gate terminal of the NMOS transistor in each inverter sub-cell.

When viewed from a fourth aspect, the present invention provides a time delay circuit comprising a plurality of differential delay cells each having a respective time delay and being arranged in series, wherein each delay cell comprises:
    first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
    wherein the back-gate terminal of the NMOS transistor in each inverter sub-cell is connected to the drain node of the other sub-cell; and
    wherein a control signal varies the time delay of the delay cell by adjusting a voltage supplied to the back-gate terminal of the PMOS transistor in each inverter sub-cell.

This fourth aspect of the invention extends to a ring oscillator circuit comprising:
    a plurality of differential delay cells arranged in a ring, each having a differential output connected to a differential input of the next differential delay cell in the ring;
    wherein each differential delay cell comprises first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
    wherein the back-gate terminal of the NMOS transistor in each inverter sub-cell is connected to the drain node of the other sub-cell; and
    wherein a control signal varies the time delay of the delay cell by adjusting a voltage supplied to the back-gate terminal of the PMOS transistor in each inverter sub-cell.

Such an asymmetric arrangement may be advantageous in that a single control voltage can be applied to both inverter sub-cells, leading to simple control of the time delay exhibited by the delay cell.

In some embodiments of the third and fourth aspects of the invention, each of the PMOS and NMOS transistors comprises a UTBB-FDSOI transistor.

However, the Applicant has appreciated that while the asymmetric arrangement described above may provide for simple control, the asymmetry may lead to greater phase noise than is desirable for some applications, e.g. due to differences in rise and fall times at the output of the delay cell.

Thus, in some alternative embodiments of the first and second aspects of the invention, both of the transistor types in each inverter sub-cell is cross-coupled (i.e. both the PMOS and NMOS), i.e. both types of transistors in the first and second inverter sub-cells provide the pseudo-differential behaviour while the transistors of the other type provide for control of the time delay/frequency of the time delay circuit. Such symmetric topologies may advantageously provide improved phase noise performance when compared to asymmetric topologies.

In the symmetric arrangement of some embodiments of the invention, the first and second inverter sub-cells may provide the pseudo-differential coupling behaviour, while the frequency control may be provided through use of further transistors, e.g. further UTBB-FDSOI transistors.

In some embodiments, the delay cell further comprises a frequency control portion comprising first and second frequency control sub-cells, wherein each of said frequency control sub-cells comprises a respective PMOS transistor and an NMOS transistor, wherein the frequency control portion is arranged such that first and second control signals vary the time delay of the delay cell, wherein the first control signal adjusts a respective voltage at the back-gate terminals of the PMOS transistors in the first and second frequency control sub-cells, and wherein the second control signal adjusts a respective voltage at the back-gate terminals of the NMOS transistors in the first and second frequency control sub-cells. In some embodiments, these transistors comprise UTBB-FDSOI transistors.

This 'symmetric' arrangement is novel and inventive in its own right and thus, when viewed from a fifth aspect, the present invention provides a time delay circuit comprising a plurality of differential delay cells each having a respective time delay and being arranged in series, wherein each delay cell comprises:

first and second inverter sub-cells, each of said inverter sub-cells comprising a respective PMOS transistor and an NMOS transistor arranged in series such that their respective drain terminals are connected at a drain node; and a frequency control portion comprising first and second frequency control sub-cells, wherein each of said frequency control sub-cells comprises a respective PMOS transistor and an NMOS transistor;

wherein each of said transistors has a back-gate terminal and is arranged such that a respective threshold voltage of said transistor is linearly dependent on a respective voltage applied to the back-gate terminal of said transistor;

wherein the back-gate terminal of each of the PMOS and NMOS transistors in each inverter sub-cell is connected to the drain node of the other sub-cell; and wherein the frequency control portion is arranged such that first and second control signals vary the time delay of the delay cell, wherein the first control signal adjusts a respective voltage at the back-gate terminals of the PMOS transistors in the first and second frequency control sub-cells, and wherein the second control signal adjusts a respective voltage at the back-gate terminals of the NMOS transistors in the first and second frequency control sub-cells.

This fifth aspect of the invention extends to a ring oscillator circuit comprising:

a plurality of differential delay cells arranged in a ring, each having a differential output connected to a differential input of the next differential delay cell in the ring;

wherein each differential delay cell comprises first and second inverter sub-cells, each of said inverter sub-cells comprising a respective PMOS transistor and an NMOS transistor arranged in series such that their respective drain terminals are connected at a drain node; and a frequency control portion comprising first and second frequency control sub-cells, wherein each of said frequency control sub-cells comprises a respective PMOS transistor and an NMOS transistor;

wherein each of said transistors has a back-gate terminal and is arranged such that a respective threshold voltage of said transistor is linearly dependent on a respective voltage applied to the back-gate terminal of said transistor;

wherein the back-gate terminal of each of the PMOS and NMOS transistors in each inverter sub-cell is connected to the drain node of the other sub-cell; and wherein the frequency control portion is arranged such that first and second control signals vary the time delay of the delay cell, wherein the first control signal adjusts a respective voltage at the back-gate terminals of the PMOS transistors in the first and second frequency control sub-cells, and wherein the second control signal adjusts a respective voltage at the back-gate terminals of the NMOS transistors in the first and second frequency control sub-cells.

In some embodiments of the fifth aspect of the invention, each of the PMOS and NMOS transistors comprises a UTBB-FDSOI transistor.

In general, the first and second control signals are controlled inversely with respect to one another, i.e. as one control signal is increased, the other is decreased. In particular embodiments, increasing the first control signal (i.e. the signal applied to the PMOS UTBB-FDSOI transistors in the first and second frequency control sub-cells) and decreasing the second control signal (i.e. the signal applied to the NMOS UTBB-FDSOI transistors in the first and second frequency control sub-cells) leads to a decrease in time delay for the delay cell, and accordingly an increase in the oscillator frequency where appropriate. Conversely, decreasing the first control signal and increasing the second control signal increases the time delay, thereby reducing the oscillator frequency.

The independent frequency control portion provided in accordance with the fifth aspect of the invention, and in some embodiments of the first and second aspects of the invention, may have a number of different topologies as appropriate.

However, in some embodiments, the respective PMOS and NMOS transistors in each of the first and second frequency control sub-cells are arranged in series such that their respective drain terminals are connected at a drain node;

wherein the drain node of the first inverter sub-cell is connected to the drain node of the first frequency control sub-cell, and wherein the drain node of the second inverter sub-cell is connected to the drain node of the second frequency control sub-cell; and wherein the gate terminals of the PMOS and NMOS transistors of the first inverter and first frequency control sub-cells are connected together, and wherein the gate terminals of the PMOS and NMOS transistors of the second inverter and second frequency control sub-cells are connected together.

Thus, in accordance with such embodiments, the frequency control portion is arranged in parallel with the first and second inverter sub-portions, which together provide a 'pseudo-differential coupling' portion. It can be seen that, in effect, the first and second frequency control sub-cells with this 'parallel' arrangement can themselves be seen as 'inverter sub-cells' as these have the same general topology, however these have a different name for ease of reference.

In an alternative set of embodiments, however, the pseudo-differential coupling and frequency control functions may be 'stacked' in a 'telescopic' topology. Thus, in some embodiments, the frequency control portion is arranged such that:

the PMOS transistor of the first frequency control sub-cell has its drain terminal connected to the source terminal of the PMOS transistor of the first inverter sub-cell;

the NMOS transistor of the first frequency control sub-cell has its drain terminal connected to the source terminal of the NMOS transistor of the first inverter sub-cell;

the PMOS transistor of the second frequency control sub-cell has its drain terminal connected to the source terminal of the PMOS transistor of the second inverter sub-cell; and the NMOS transistor of the second frequency control sub-cell has its drain terminal connected to the source terminal of the NMOS transistor of the second inverter sub-cell;

wherein the gate terminals of the PMOS and NMOS transistors of the first frequency control sub-cell are connected to the gate terminals of the PMOS and NMOS transistors of the first inverter sub-cell; and wherein the gate terminals of the PMOS and NMOS transistors of the second frequency control sub-cell are connected to the gate terminals of the PMOS and NMOS transistors of the second inverter sub-cell.

The choice between the 'parallel' and 'telescopic' topologies may be determined by design considerations. Generally, embodiments that use the parallel topology may be faster but have a higher power consumption than the telescopic topology. Conversely, embodiments that use the telescopic topology may be more power efficient but be slower than the parallel topology.

It will be appreciated that all optional features described hereinabove in relation to any aspect of the invention also apply equally to the other aspects of the invention in any combination.

BRIEF DESCRIPTION OF DRAWINGS

Certain embodiments of the invention will now be described, by way of example only, with reference to the accompanying drawings in which:

FIGS. 15A and 15B are circuit diagrams ring oscillators that use the pseudo-differential delay cell of FIG. 11 or FIG. 12 with an odd and even number of cells respectively.

DETAILED DESCRIPTION

Figure 1B:
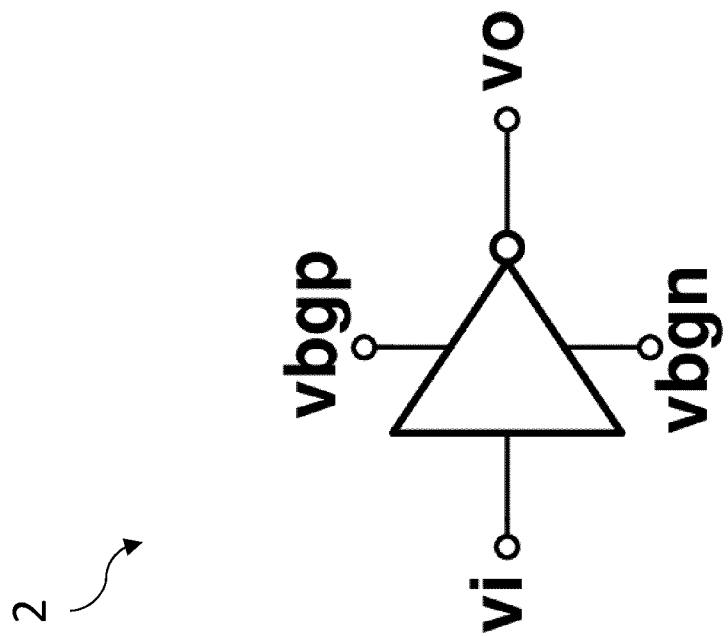
FIGS. 1A and 1B are a circuit diagram and a schematic diagram of an inverter sub-cell respectively.
Figure 1A:
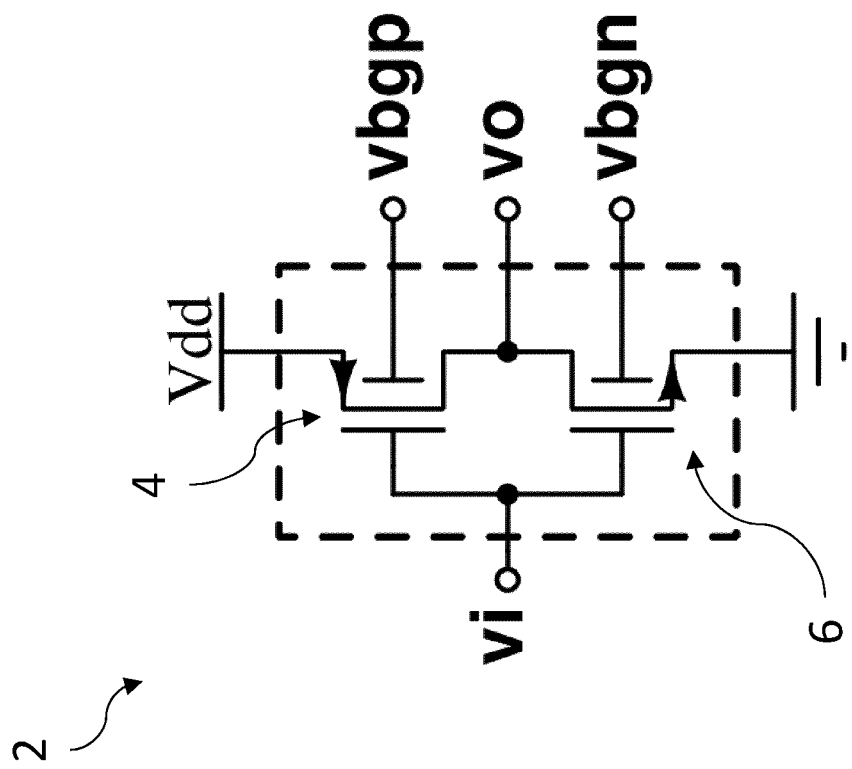

FIGS. 1A and 1B are a circuit diagram and a schematic diagram of an inverter sub-cell 2 respectively. As can be seen in FIG. 1A, the inverter sub-cell is constructed from a PMOS UTBB-FDSOI transistor 4 and an NMOS UTBB-FDSOI transistor 6, arranged in series. It will be appreciated that while UTBB-FDSOI transistors are used in the specific embodiments of the invention described below, other transistor technologies having the required characteristics of a threshold voltage that is linearly dependent on a voltage applied to its back-gate terminal could be used instead.

The transistors 4, 6 are connected at their respective gate terminals to an input terminal supplied with an input voltage vi, and at their respective drain terminals to an output terminal that produces an output voltage vo.

The source terminal of the PMOS transistor 4 is connected to the supply voltage Vdd, and the source terminal of the NMOS transistor 6 is connected to the ground rail. It will, of course, be appreciated that different supply rails or connections could be used as appropriate, for example by connecting the source terminal of the NMOS transistor 6 to a negative supply rail instead of to ground.

A positive control voltage vbgp is applied to the back-gate terminal of the PMOS transistor 4, and a negative control voltage vbgn is applied to the back-gate terminal of the NMOS transistor 6. By varying each of these control voltages vbgp, vbgn, the speed of the transistors 4, 6—and thus the inverter sub-cell 2—can be controlled.

Figure 2:
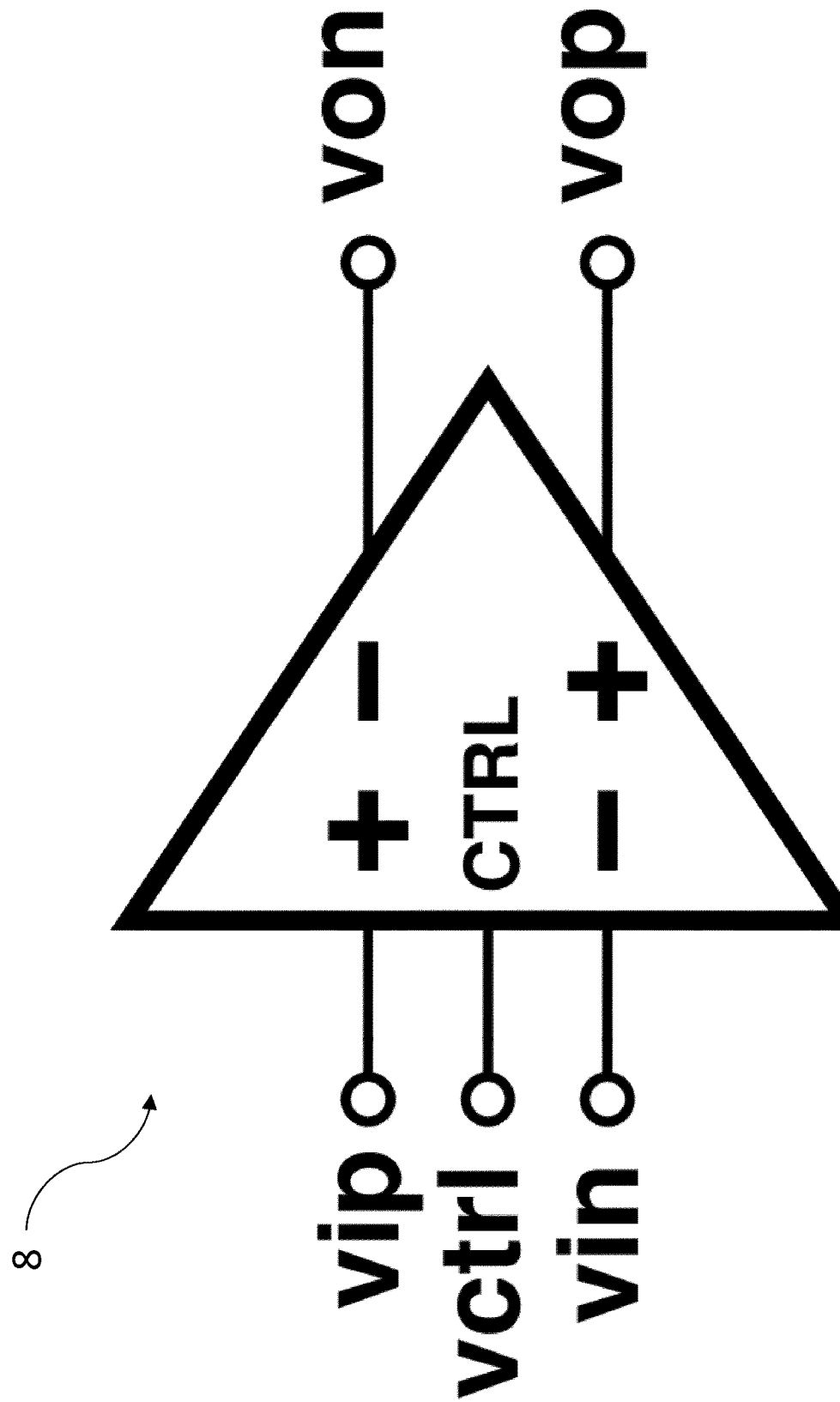
FIG. 2 is a schematic diagram of a delay cell.

By combining two of these inverter sub-cells 2, a pseudo-differential delay cell 8 may be constructed, as illustrated in FIG. 2, which shows the diagrammatic symbol for such a cell 8. Differential input voltages vip, vin are applied the two sub-cells 2 such that each sub-cell 2 receives one of the input voltages vip, vin, as is more clearly illustrated in e.g. FIGS. 3 and 4 below. The delay cell 8 also produces differential output voltages von, vop, where each sub-cell 2 produces one of the output voltages von, vop, as discussed in further detail later. A control voltage vctrl is supplied to a control input, i.e. to the back-gates of the transistors 4, 6 in each sub-cell 2, which controls the time delay of each sub-cell 2, and thus of the the delay cell 8.

It will be understood that the term 'time delay' as used herein, means the time difference between when a change is made to the input of an element (i.e. a sub-cell 2 or delay cell 8)— that is, to the appropriate input voltage vi, vip, vin— and when the change is effected at the corresponding output, i.e. the output voltage vo, von, vop of that element.

Figure 3:
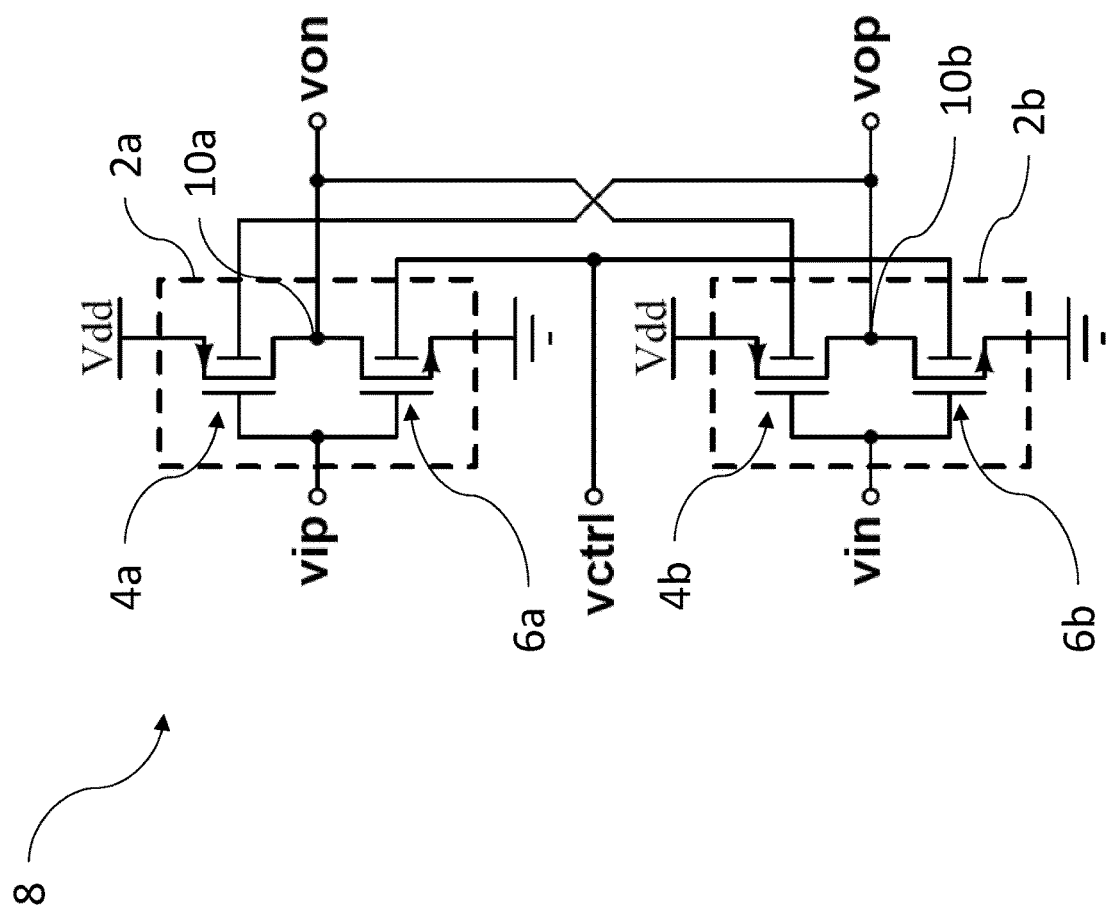
FIG. 3 is a circuit diagram of an asymmetric pseudo-differential delay cell in accordance with an embodiment of the present invention.

FIG. 3 is a circuit diagram of an asymmetric pseudo-differential delay cell 8 in accordance with an embodiment of the present invention. As discussed above, the delay cell 8 is constructed from two inverter sub-cells 2a, 2b.

Each of the inverter sub-cells 2a, 2b is constructed from a respective PMOS UTBB-FDSOI transistor 4a, 4b and a respective NMOS UTBB-FDSOI transistor 6a, 6b. These pairs of transistors 4a, 6a and 4b, 6b are arranged in series such that their respective drain terminals are connected at a respective drain node 10a, 10b. The source terminals of the PMOS transistors 4a, 4b are connected to the positive supply rail Vdd and the source terminals of the NMOS transistors 6a, 6b are connected to the ground rail.

The drain node 10a of the first inverter sub-cell 2a produces the negative output voltage von, while the drain node 10b of the second inverter sub-cell 2b produces the positive output voltage vop, i.e. there is a 'cross-over' from the positive and negative inputs to the negative and positive outputs.

The respective back-gate terminal of each of the PMOS UTBB-FDSOI transistors 4a, 4b in each inverter sub-cell 2a, 2b is connected to the drain node 10a, 10b of the other sub-cell 2a, 2b. This cross-coupling provides the pseudo-differential behaviours of the delay cell 8.

The back-gate terminals of each of the NMOS UTBB-FDSOI transistors 6a, 6b in each inverter sub-cell 2a, 2b are connected to a control terminal that applies a control voltage vctrl to these back-gate terminals. This control voltage vctrl varies the time delay of the delay cell 8 by adjusting the voltage supplied to the back-gate terminals of the NMOS UTBB-FDSOI transistors 6a, 6b. This process is described in further detail below with reference to FIGS. 7 to 9.

Figure 4:
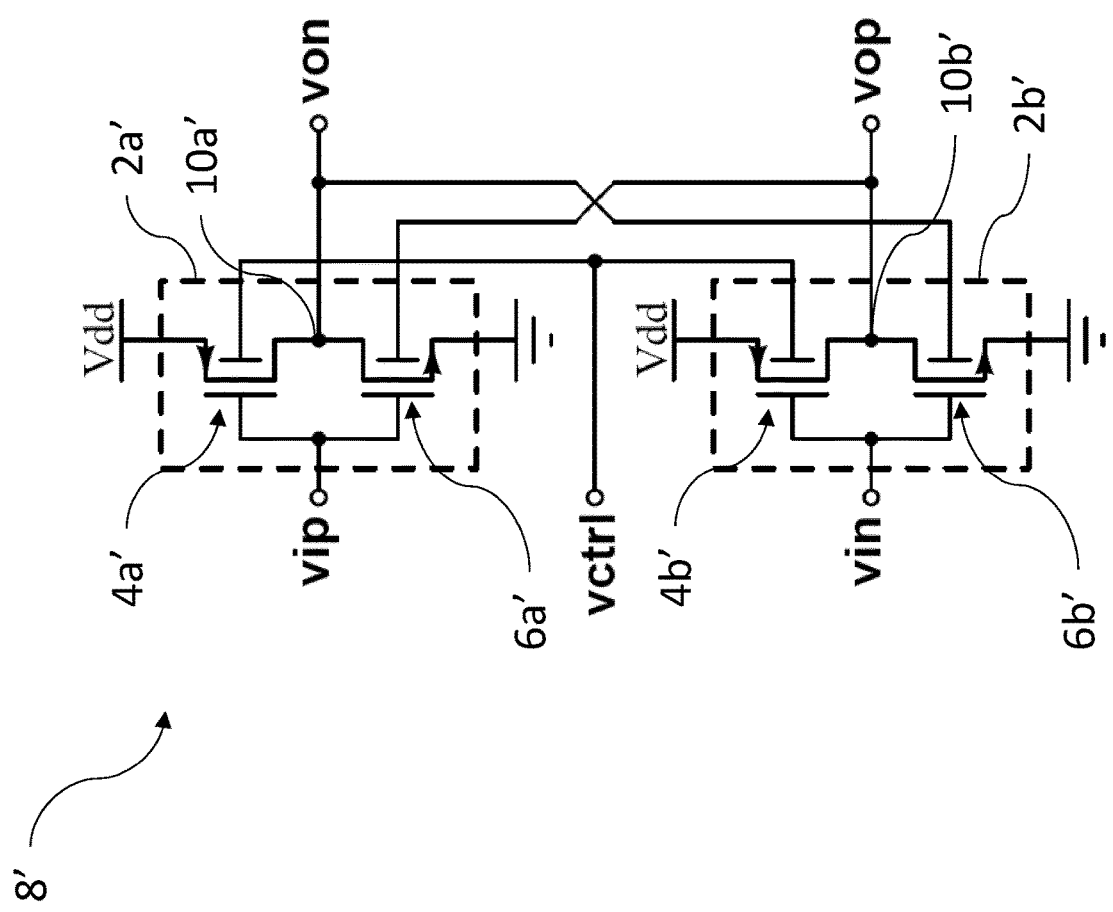
FIG. 4 is a circuit diagram of an asymmetric pseudo-differential delay cell in accordance with an alternative embodiment of the present invention.

FIG. 4 is a circuit diagram of an asymmetric pseudo-differential delay cell 8' in accordance with an alternative embodiment of the present invention. It will be appreciated that elements having like reference numerals appended with a prime symbol correspond to those elements having the same reference numeral without the prime symbol described above with reference to FIGS. 1 to 3.

The structure of the delay cell 8' of FIG. 4 is similar to that of the delay cell 8 of FIG. 3, except that the roles of the PMOS and NMOS transistors are reversed.

Specifically, in the delay cell 8' of FIG. 4, the respective back-gate terminal of each of the NMOS UTBB-FDSOI transistors 6a', 6b' in each inverter sub-cell 2a', 2b' is connected to the drain node 10a', 10b' of the other sub-cell 2a', 2b' and provides the pseudo-differential behaviours of the delay cell 8'.

The back-gate terminals of each of the PMOS UTBB-FDSOI transistors 4a', 4b' in each inverter sub-cell 2a', 2b' are connected to a control terminal that applies a control voltage vctrl to these back-gate terminals. This control voltage vctrl varies the time delay of the delay cell 8' by adjusting the voltage supplied to the back-gate terminals of the PMOS UTBB-FDSOI transistors 4a', 4b'.

Contrary to the delay cell 8 of FIG. 3, in the delay cell 8' of FIG. 4, the respective back-gate terminals of the NMOS UTBB-FDSOI transistor in each inverter sub-cell is connected to the drain node 10a', 10b' of the other sub-cell 2a', 2b'.

Figure 5:
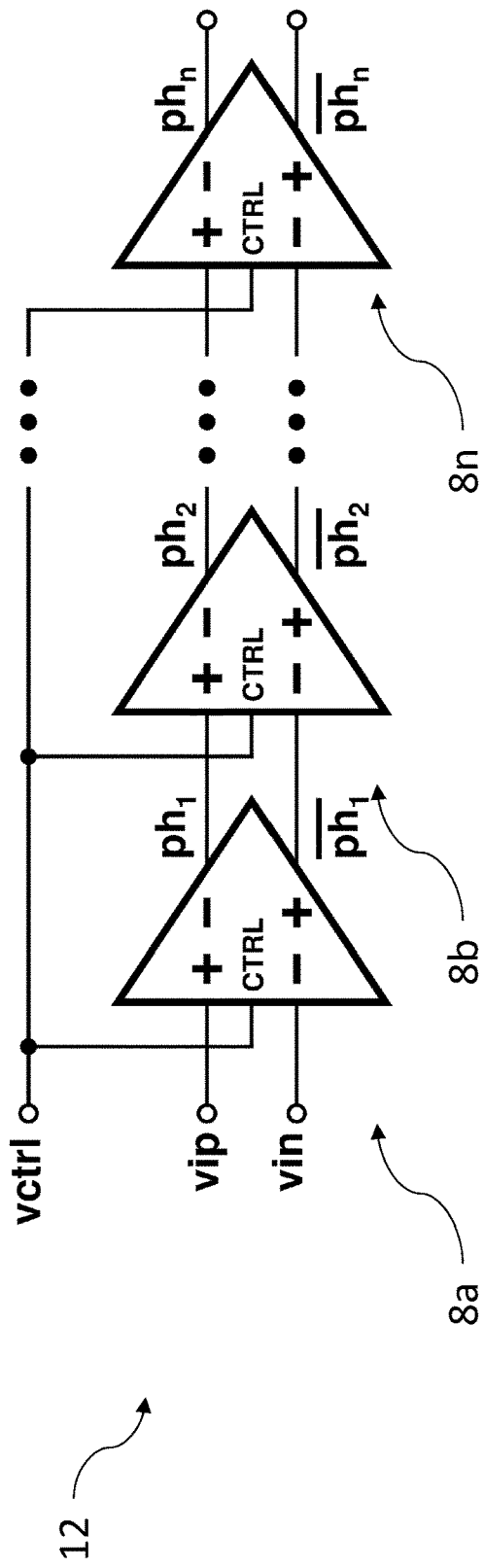
FIG. 5 is a circuit diagram of a delay line that uses the pseudo-differential delay cell of FIG. 3.

FIG. 5 is a circuit diagram of a delay line 12 that uses the pseudo-differential delay cell 8 of FIG. 3. As can be seen in FIG. 5, the delay line 12 is constructed from N delay cells 8a, 8b, 8n arranged in series. For clarity of illustration, the individual components of the delay cells 8a, 8b, 8n are not labelled, however the components of each delay cell 8a, 8b, 8n has the same structure and function as those described above in relation to the delay cell 8 of FIG. 3.

The N delay cells 8a, 8b, 8n are arranged in series such that the negative and positive outputs of each delay cell 8a, 8b . . . are connected to the positive and negative inputs of the next delay cell 8b, 8n in the chain. The differential output—i.e. the difference between the negative outputs ph1, ph2, . . . , phn and positive outputs $\overline{ph1}$, $\overline{ph2}$, . . . , $\overline{phn}$—of each delay cell stage 8a, 8b, 8n is a time-delayed version of the differential input to that delay cell stage 8a, 8b, 8n.

By varying the value of the control voltage vctrl, the time delay introduced by each delay cell 8a, 8b, . . . , 8n is varied, and thus the total propagation delay of the delay line 12 is also varied.

Figure 6A:
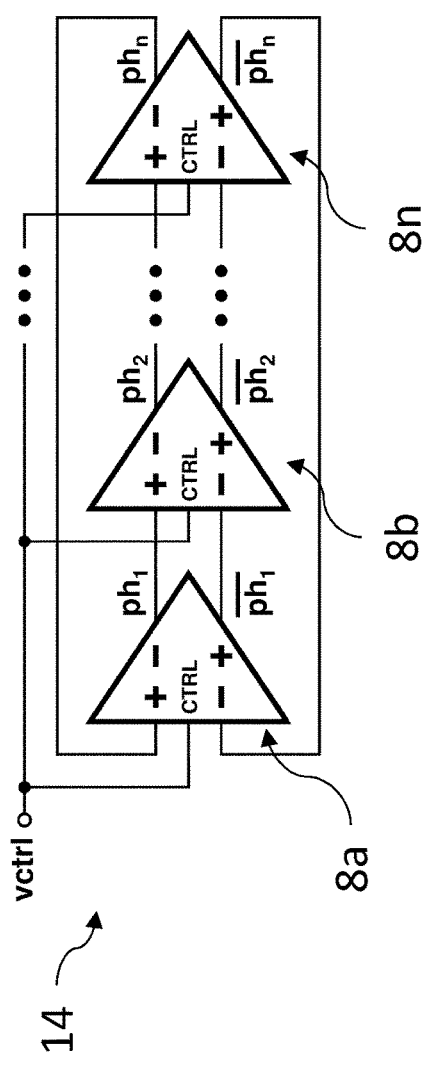
FIGS. 6A and 6B are circuit diagrams of ring oscillators that use the pseudo-differential delay cell of FIG. 3.
Figure 6B:
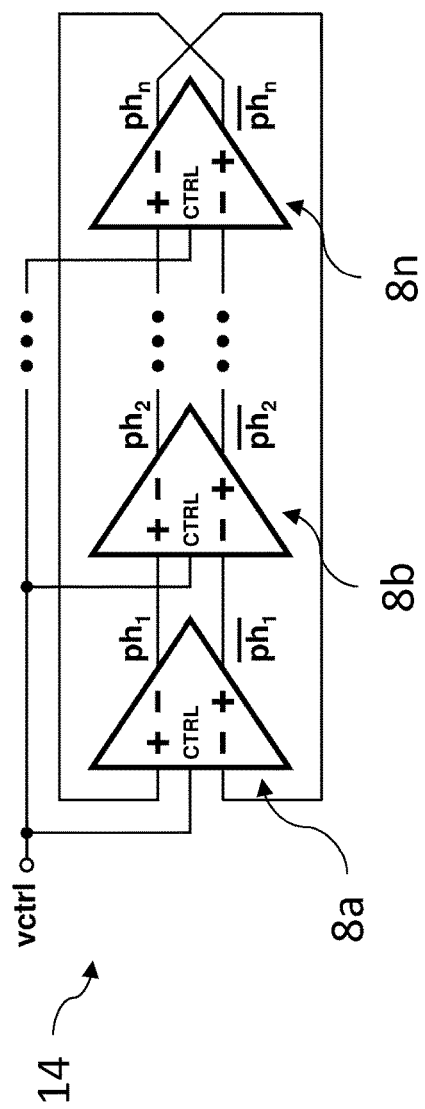

FIGS. 6A and 6B are circuit diagrams of ring oscillators 14, 14' that use the pseudo-differential delay cell of FIG. 3. It will be appreciated that, like the delay line 12 of FIG. 5, the number N of stages may be selected as appropriate, where an odd number N of cells may be used as per the topology of FIG. 6A, and an even number N of cells may be used as per the topology of FIG. 6B, as outlined below.

As can be seen in FIG. 6A, the ring oscillator 14 is constructed from an odd number N of delay cells 8a, 8b, 8n arranged in series, in a loop. For clarity of illustration, the individual components of the delay cells 8a, 8b, 8n are not labelled, however the components of each delay cell 8a, 8b, 8n has the same structure and function as those described above in relation to the delay cell 8 of FIG. 3.

Unlike the delay line 12 of FIG. 5, in the ring oscillator 14 the N delay cells 8a, 8b, . . . , 8n are arranged in a loop, i.e. the output of the 'last' delay cell 8n is connected back to the input of the 'first' delay cell 8a. It will of course be appreciated that the terms 'first' and 'last' are used to provide contrast to the delay cells in the delay line 12, as there is no 'first' or 'last' delay cell by virtue of it being a loop. The inverting output of each delay cell stage 8a, 8b, . . . , 8n is connected to the non-inverting input of the next delay cell stage 8a, 8b, . . . , 8n in the loop. Similarly, the non-inverting output of each delay cell stage 8a, 8b, . . . , 8n is connected to the inverting input of the next delay cell stage 8a, 8b, . . . , 8n in the loop The loop of the ring oscillator 14 is 'unstable' and, assuming a sufficiently high gain for each stage, the output of each delay cell stage 8a, 8b, 8n alternates between a high value and a low value, providing a substantially square waveform at each output.

Conversely, the ring oscillator 14' of FIG. 6B uses an even number N of delay cells 8a, 8b, . . . , 8n arranged in series, in a loop. In this arrangement, the inverting output of all but the last delay cell stage 8a, 8b, . . . , 8n-1 is connected to the non-inverting input of the next delay cell stage 8b, 8c, . . . , 8n in the loop; and the non-inverting output of all but the last delay cell stage 8a, 8b, . . . , 8n-1 is connected to the inverting input of the next delay cell stage 8b, 8c, . . . , 8n in the loop.

However, when using an even number N of delay cells 8a, 8b, 8n, the inverting and non-inverting outputs of one of the delay cells are 'crossed over' so that they are connected to inverting and non-inverting inputs respectively (rather than to their opposite type as in the rest of the cases). In this example, the inverting and non-inverting outputs of the 'last' delay cell stage 8n are respectively connected to the inverting and non-inverting outputs of the first delay cell stage 8a. It will, of course, be appreciated that the term 'last' is arbitrary in a loop structure, and any selected one of the even number N of delay cells 8a, 8b, 8n may have its outputs 'crossed over' in this way.

By varying the value of the control voltage vctrl, the time delay introduced by each delay cell 8a, 8b, . . . , 8n is varied, and thus the frequency of the ring oscillator 14 is also varied.

Figure 7:
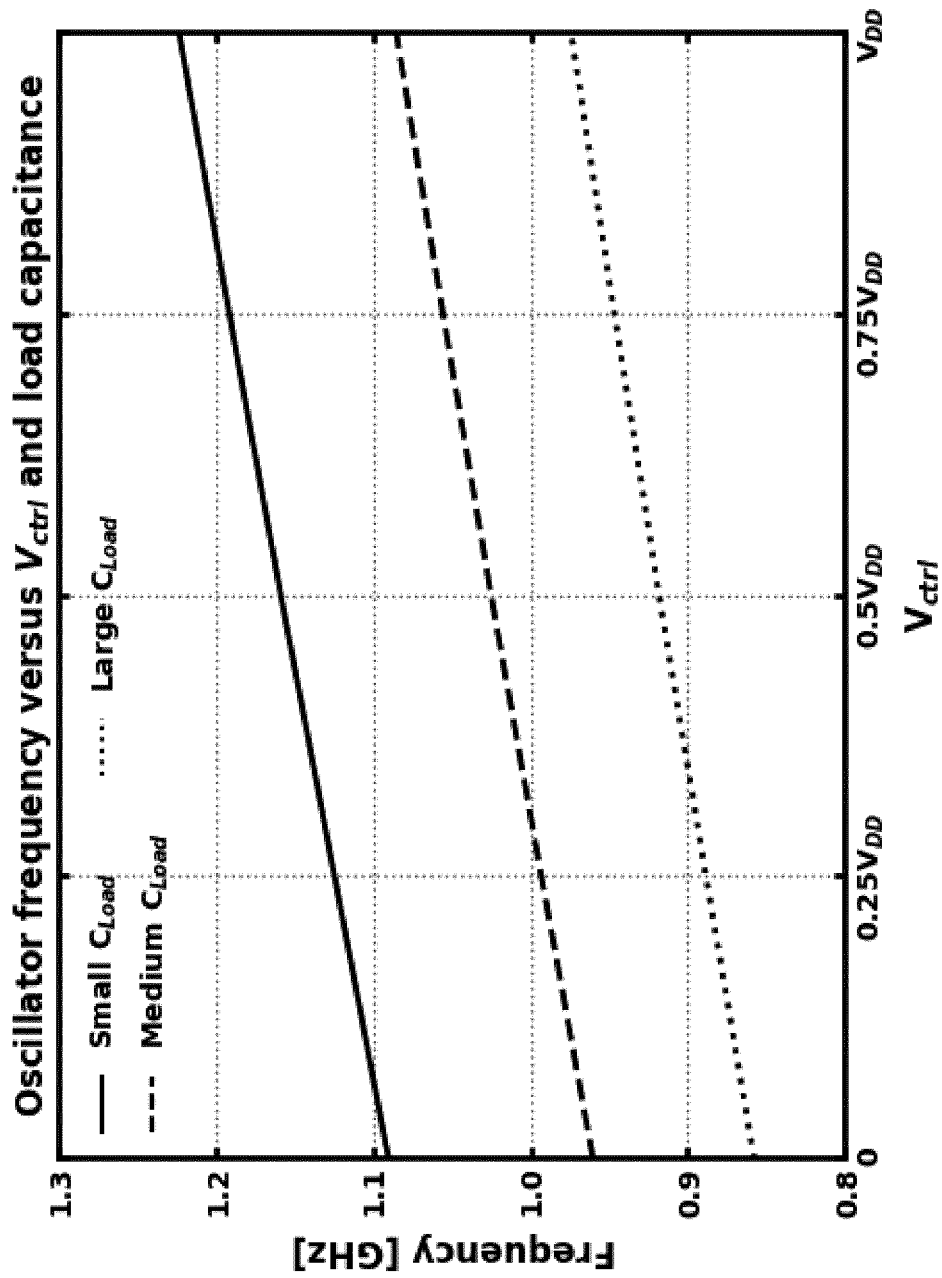
FIG. 7 is a graph illustrating how the frequency of the oscillators of FIGS. 6A and 6B depend on the control voltage.
Figure 8:
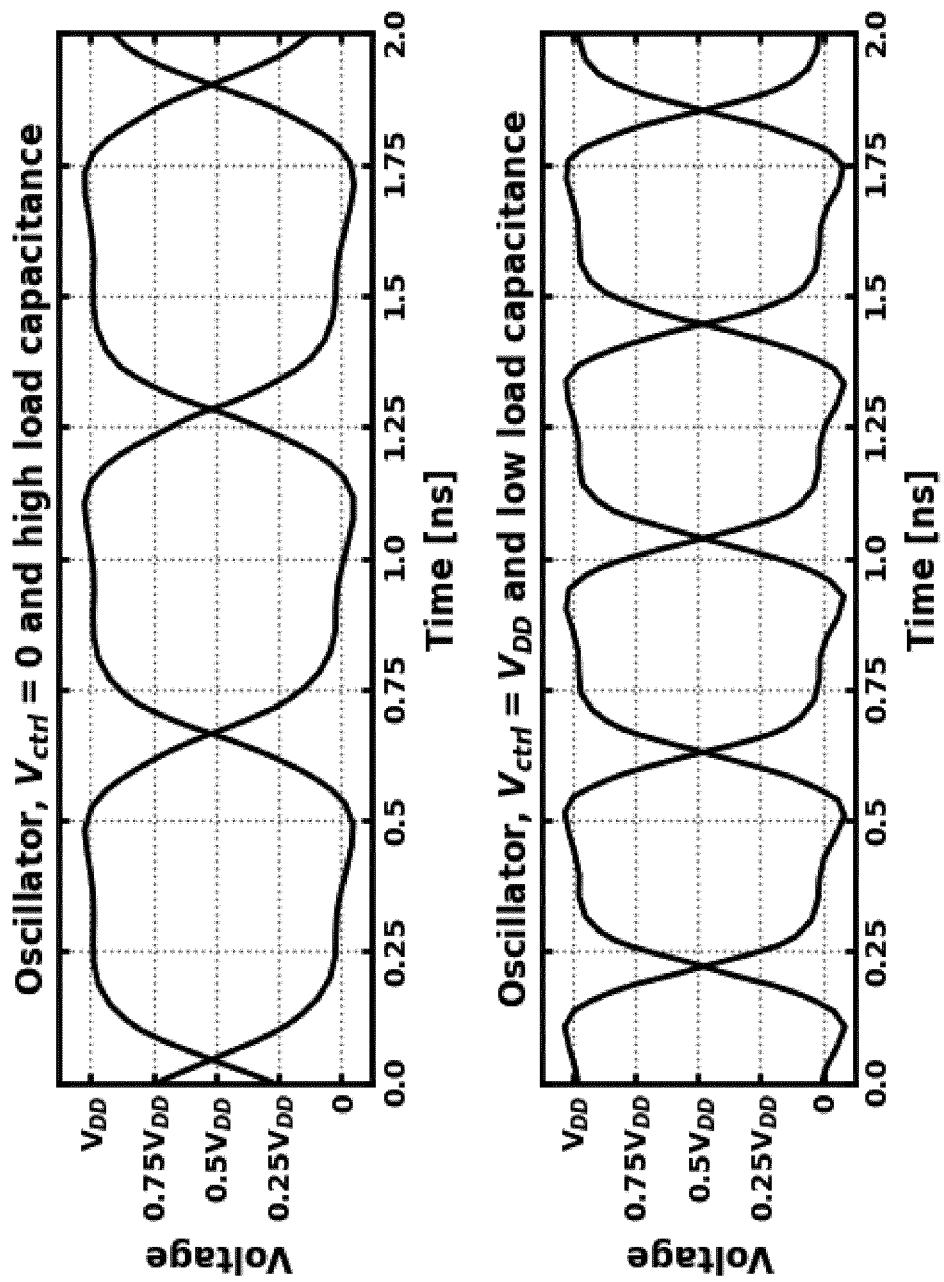
FIG. 8 is a graph illustrating how the frequency of the oscillators of FIGS. 6A and 6B depends on the control voltage and load capacitance.

FIG. 7 is a graph illustrating how the frequency of the ring oscillators 14, 14' of FIGS. 6A and 6B depends on the control voltage. It can be readily seen that the value of the control voltage $V_{ctrl}$ can take any value between 0 V and $V_{DD}$, i.e. full rail-to-rail control is available. This is also shown in the time domain, in the plots in the graph of FIG. 8.

As the control voltage $V_{ctrl}$ is increased, the frequency of the ring oscillator 14 increases. Advantageously, this increase in frequency is highly linear with the change in control voltage, making control of the oscillator frequency far simpler than is typical of prior art arrangements.

Additionally, decreasing the load capacitance $C_{Load}$ (not shown) connected across the output of the ring oscillator 14 leads to an increase in the frequency of the ring oscillator 14. It will be appreciated that this load capacitance $C_{Load}$ may be seen as the total device and additional load capacitance on each node.

Figure 9:
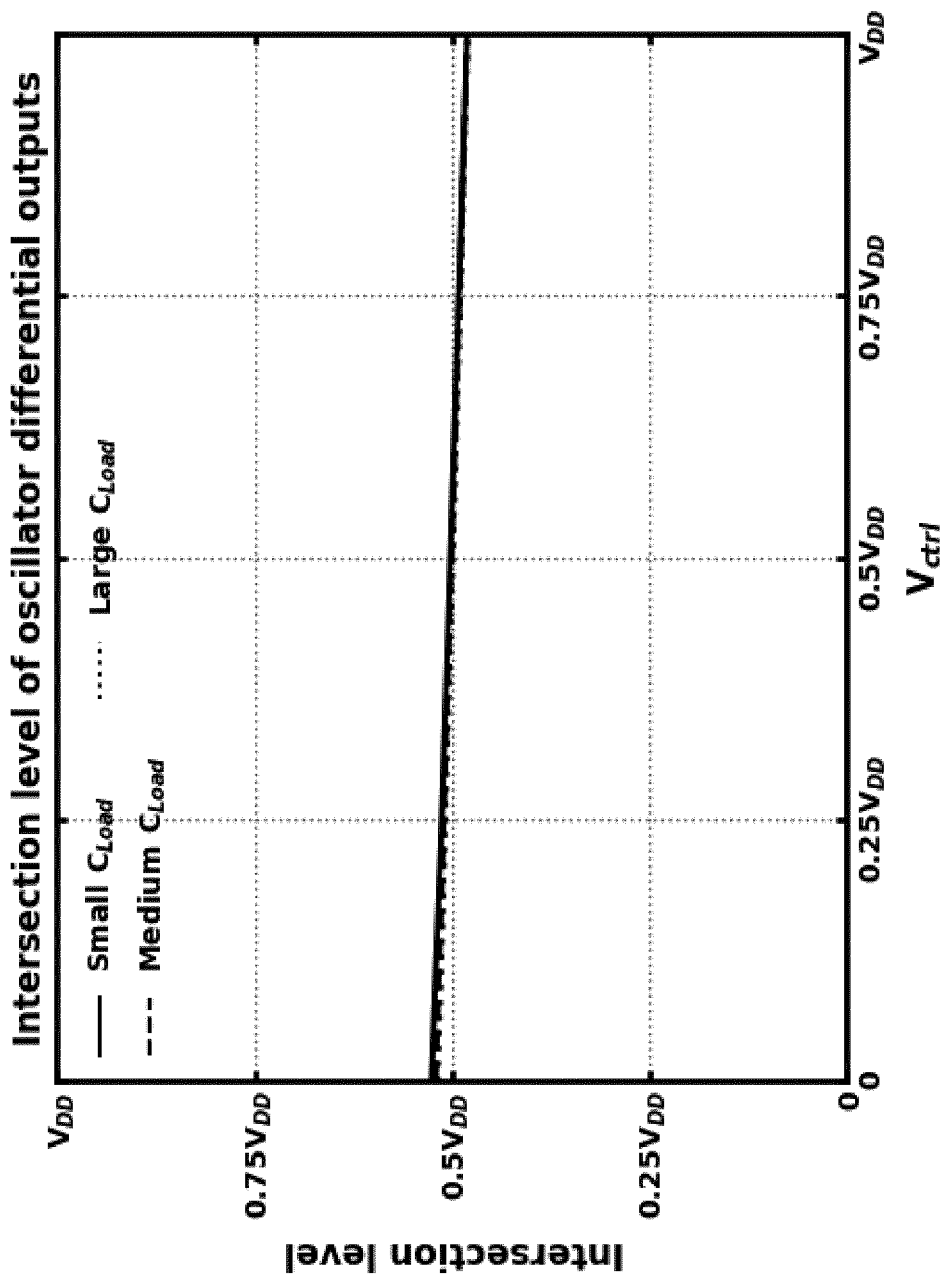
FIG. 9 is a graph illustrating the dependence of the intersection level of the oscillators' differential outputs on the control voltage.

FIG. 9 is a graph illustrating the dependence of the intersection level of the differential outputs of the ring oscillators 14, 14' on the control voltage $V_{ctrl}$. Those skilled in the art will appreciate that the graph of FIG. 9 demonstrates that the crossing/intersection level of the single-ended output signals maintain levels near the oscillator common mode level, i.e. $V_{DD}/2$, across a wide range of tuning conditions.

Figure 10B:
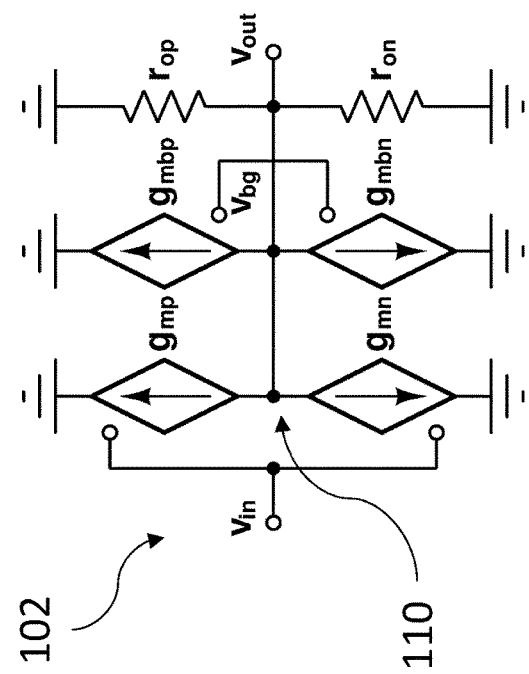
FIGS. 10A-C are circuit and schematic diagrams of an inverter sub-cell for use in a symmetric pseudo-differential delay cell.
Figure 10C:
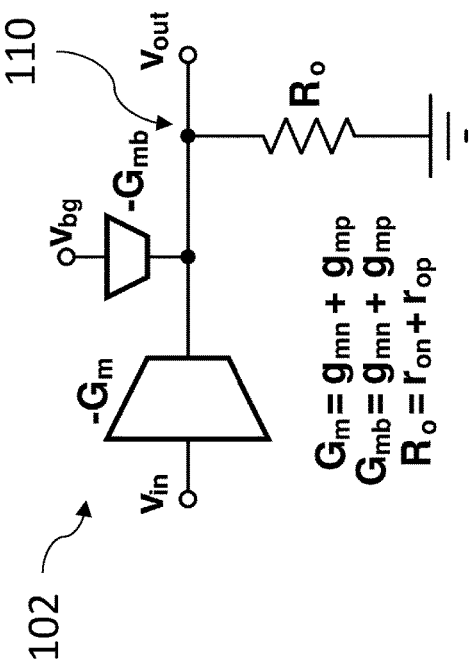
Figure 10A:
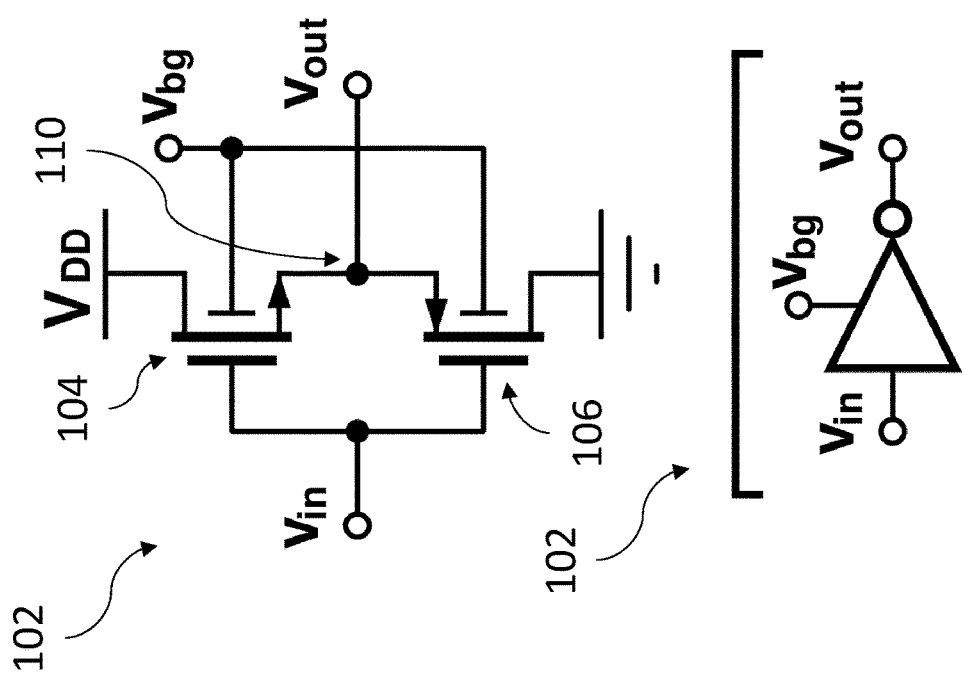

FIGS. 10A-C are circuit and schematic diagrams of an inverter sub-cell 102 for use in a symmetric pseudo-differential delay cell. Specifically, FIG. 10A shows a circuit diagram and symbol for the inverter sub-cell 102; FIG. 10B shows a small signal model of the inverter sub-cell 102; and FIG. 10O shows a simplified small signal model of the inverter sub-cell 102.

As can be seen in FIG. 10A, the inverter sub-cell 102 is constructed from PMOS and NMOS UTBB-FDSOI transistors 104, 106 arranged in series such that their drain terminals are connected at a drain node 110 that supplies the output voltage $v_{out}$. The gate terminals of the transistors 104, 106 are connected together and receive the input voltage yin.

In this arrangement, the back-gate terminals of the two transistors 104, 106 are connected together and both receive the same back-gate control voltage $v_{bg}$. This arrangement is used as a building block in the delay cell arrangements of FIGS. 11 and 12 as described below.

Figure 11:
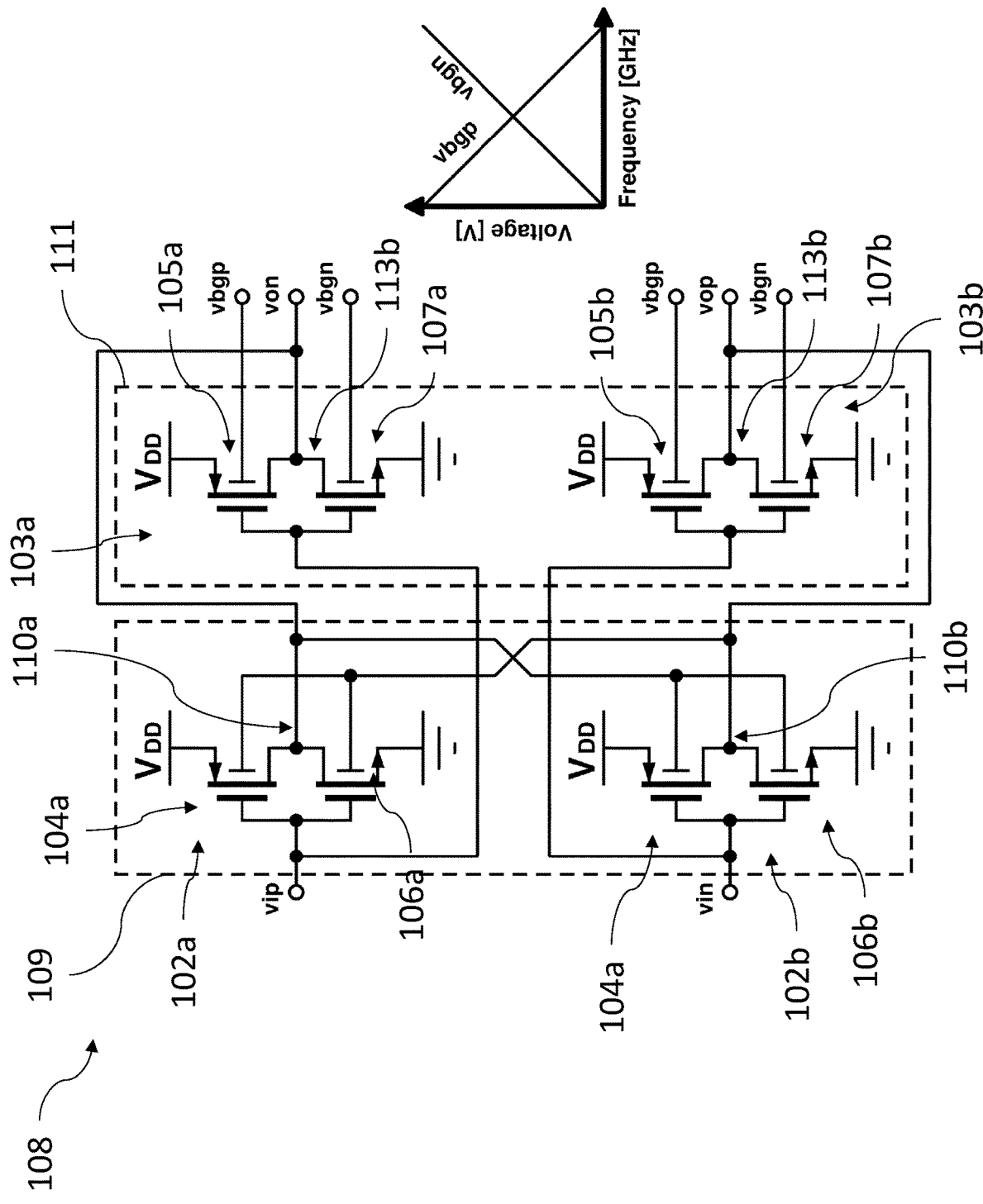
FIG. 11 is a circuit diagram of a symmetric pseudo-differential delay cell in accordance with a further embodiment of the present invention.

FIG. 11 is a circuit diagram of a symmetric pseudo-differential delay cell 108 in accordance with a further embodiment of the present invention. As can be seen in FIG. 11, there are two 'portions' of the delay cell 108: a pseudo-differential coupling portion 109 and a frequency control portion 111.

The pseudo-differential coupling portion 109 is constructed from a pair of inverter sub-cells 102a, 102b, where each inverter sub-cell 102a, 102b is constructed from respective PMOS UTBB-FDSOI transistors 104a, 104b and NMOS UTBB-FDSOI transistors 106a, 106b arranged in series such that their drain terminals are connected together at respective drain nodes 110a, 110b.

The back-gate terminals of these transistors 104a, 104b, 106a, 106b are cross-coupled such that the back-gate terminals of the PMOS and NMOS transistors 104a, 106a in the first inverter sub-cell 102a are connected to the drain node 110b of the second inverter sub-cell 102b; and the back-gate terminals of the PMOS and NMOS transistors 104b, 106b in the second inverter sub-cell 102b are connected to the drain node 110a of the first inverter sub-cell 102a. Thus both types of transistors in the first and second inverter sub-cells 102a, 102b provide the pseudo-differential behaviour.

The gate terminals of the transistors 104a, 106a of the first inverter sub-cell 102a are connected together and supplied with the positive input voltage vip to the delay cell 108, and the gate terminals of the transistors 104b, 106b of the second inverter sub-cell 102b are connected together and supplied with the negative input voltage vin to the delay cell 108.

The drain nodes 110a, 110b of the two inverter sub-cells 102a, 102b are arranged to provide the negative voltage output von and positive voltage output vop respectively.

The frequency control portion 111 is also constructed from a pair of inverter sub-cells 103a, 103b, where each inverter sub-cell 103a, 103b is constructed from respective PMOS UTBB-FDSOI transistors 105a, 105b and NMOS UTBB-FDSOI transistors 107a, 107b arranged in series such that their drain terminals are connected together at respective drain nodes 113a, 113b.

The drain node 113a of the third inverter sub-cell 103a is connected to the drain node 110a of the first inverter sub-cell 102a within the pseudo-differential coupling portion 109, and thus to the output terminal that provides the negative voltage output von. Similarly, the drain node 113b of the fourth inverter sub-cell 103b is connected to the drain node 110b of the second inverter sub-cell 102b within the pseudo-differential coupling portion 109, and thus to the output terminal that provides the positive voltage output vop.

The back-gate terminals of the PMOS UTBB-FDSOI transistors 105a, 105b in the inverter sub-cells 103a, 103b in the frequency control portion 111 are connected to a first 'positive' control voltage vbgp; and the back-gate terminals of the NMOS UTBB-FDSOI transistors 107a, 107b in the inverter sub-cells 103a, 103b in the frequency control portion 111 are connected to a second 'negative' control voltage vbgn.

Thus in this symmetric arrangement, the pseudo-differential portion 109 and frequency control portion 111 are in parallel to one another, such that the pseudo-differential portion 109 cross-couples the inputs to the delay cell 108 while the frequency control portion 111 controls the time delay of the delay cell 108.

In order to effect this control of the time delay of the delay cell 108, the two control signals vbgp, vbgn are controlled 'inversely' of one another, i.e. as one is increased the other is decreased. Specifically, as the positive control signal vbgp is increased and the negative control signal vbgn is decreased, the frequency of the delay cell 108—i.e. the reciprocal of the time delay of the delay cell—increases. Conversely, as the positive control signal vbgp is decreased and the negative control signal vbgn is increased, the frequency of the delay cell 108 decreases.

Figure 12:
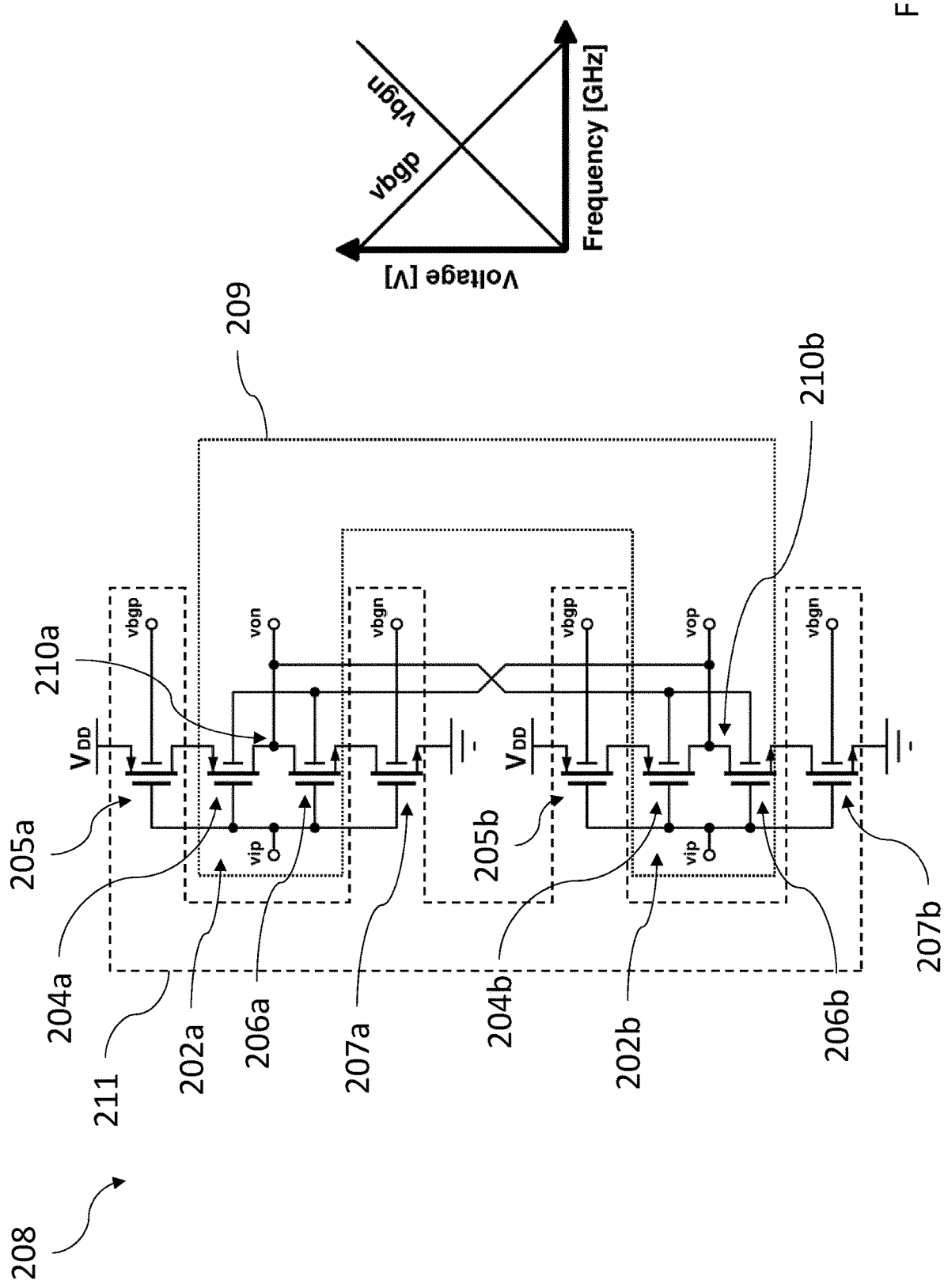
FIG. 12 is a circuit diagram of another symmetric pseudo-differential delay cell in accordance with another embodiment of the present invention.

FIG. 12 is a circuit diagram of another symmetric pseudo-differential delay cell 208 in accordance with another embodiment of the present invention.

The choice between the 'parallel' topology of FIG. 11 and the 'telescopic' topology of FIG. 12 may be determined by design considerations. The delay cell 108 of FIG. 11 that uses the parallel topology may be faster but have a higher power consumption than the delay cell 208 of FIG. 12 that uses the telescopic topology.

As can be seen in FIG. 12, there are two 'portions' of the delay cell 208: a pseudo-differential coupling portion 209 and a frequency control portion 211.

The pseudo-differential coupling portion 209 is constructed from a pair of inverter sub-cells 202a, 202b, where each inverter sub-cell 202a, 202b is constructed from respective PMOS UTBB-FDSOI transistors 204a, 204b and NMOS UTBB-FDSOI transistors 206a, 206b arranged in series such that their drain terminals are connected together at respective drain nodes 210a, 210b.

The back-gate terminals of these transistors 204a, 204b, 206a, 206b are cross-coupled such that the back-gate terminals of the PMOS and NMOS transistors 204a, 206a in the first inverter sub-cell 202a are connected to the drain node 210b of the second inverter sub-cell 202b; and the back-gate terminals of the PMOS and NMOS transistors 204b, 206b in the second inverter sub-cell 202b are connected to the drain node 210a of the first inverter sub-cell 202a. Thus both types of transistors in the first and second inverter sub-cells 202a, 202b provide the pseudo-differential behaviour.

The gate terminals of the transistors 204a, 206a of the first inverter sub-cell 202a are connected together and supplied with the positive input voltage vip to the delay cell 208, and the gate terminals of the transistors 204b, 206b of the second inverter sub-cell 202b are connected together and supplied with the negative input voltage vin to the delay cell 208.

The drain nodes 210a, 210b of the two inverter sub-cells 202a, 202b are arranged to provide the negative voltage output von and positive voltage output vop respectively.

In the telescopic topology of FIG. 12, the frequency control portion 211 is 'stacked' around the frequency control portion 209, i.e. the frequency control PMOS UTBB-FDSOI transistors 205a, 205b and NMOS UTBB-FDSOI transistors 207a, 207b that provide control to each of the inverter sub-cells 202a, 202b are positions above and below the corresponding PMOS transistors 204a, 204b and NMOS transistors 206a, 206b respectively, as shown in FIG. 12.

The back-gate terminals of the PMOS UTBB-FDSOI transistors 205a, 205b in the frequency control portion 211 are connected to a first 'positive' control voltage vbgp; and the back-gate terminals of the NMOS UTBB-FDSOI transistors 207a, 207b in the frequency control portion 211 are connected to a second 'negative' control voltage vbgn.

Thus in this symmetric arrangement, the pseudo-differential portion 209 and frequency control portion 211 are stacked telescopically, where the pseudo-differential portion 209 cross-couples the inputs to the delay cell 208 while the frequency control portion 211 controls the time delay of the delay cell 208.

As in the parallel topology of FIG. 11, the two control signals vbgp, vbgn are controlled 'inversely' of one another. Thus, as the positive control signal vbgp is increased and the negative control signal vbgn is decreased, the frequency of the delay cell 208—i.e. the reciprocal of the time delay of the delay cell—increases. Conversely, as the positive control signal vbgp is decreased and the negative control signal vbgn is increased, the frequency of the delay cell 208 decreases.

Figure 13:
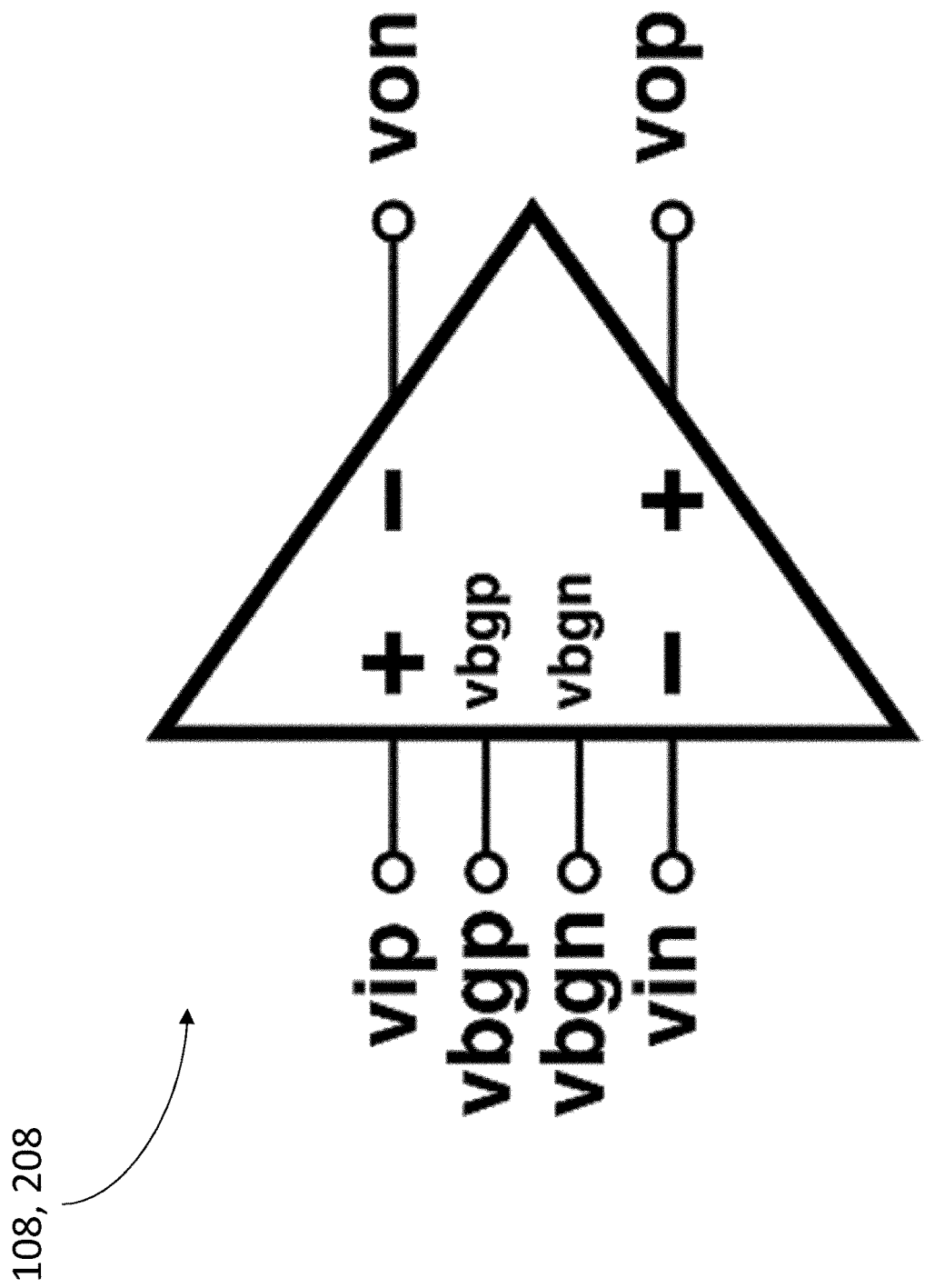
FIG. 13 is a schematic diagram of a pseudo-differential delay cell that uses the topology of either FIG. 11 or FIG. 12.

FIG. 13 is a schematic diagram showing a circuit symbol for a pseudo-differential delay cell 108, 208 that uses the topology of either FIG. 11 or FIG. 12. The same symbol is used for both topologies, as the connections to the cells 108, 208 are the same, regardless of whether the parallel topology of FIG. 11 or telescopic topology of FIG. 12 is used.

Figure 14:
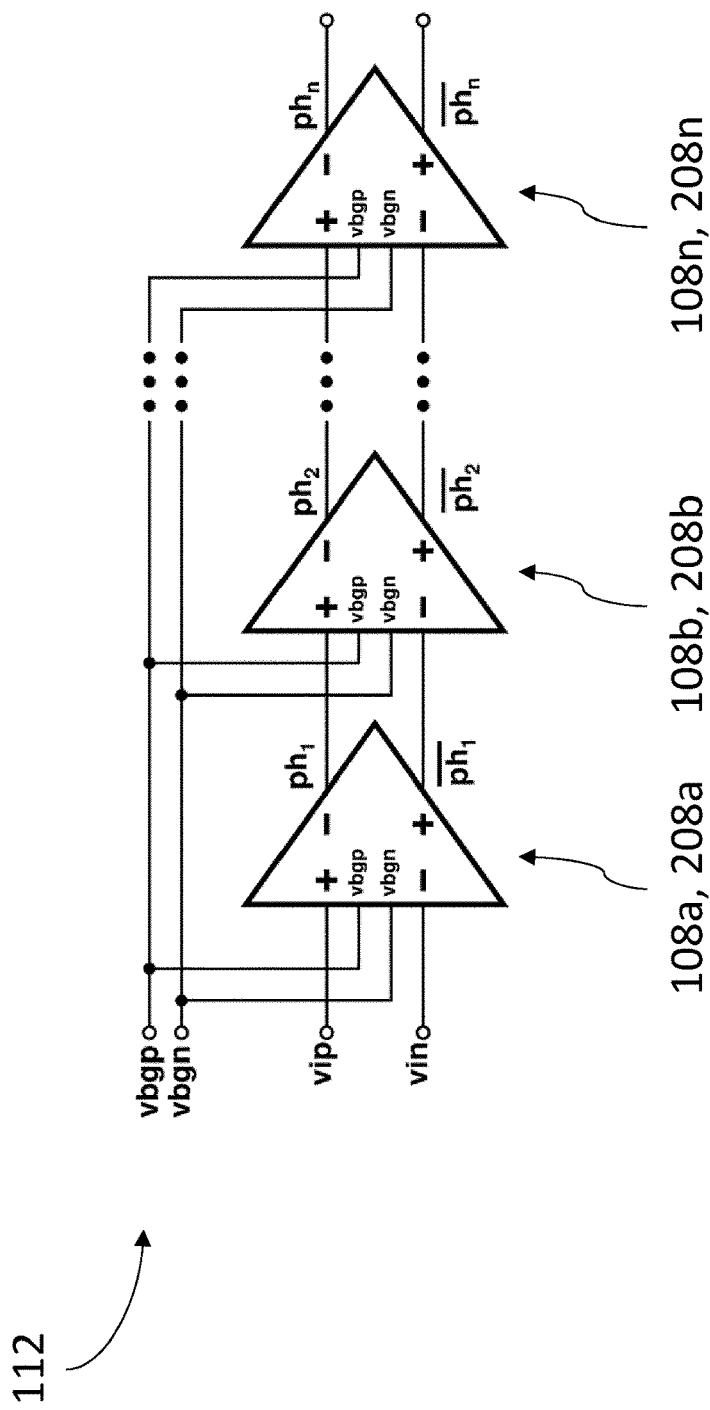
FIG. 14 is a circuit diagram of a delay line that uses the pseudo-differential delay cell of FIG. 11 or FIG. 12.

FIG. 14 is a circuit diagram of a delay line that uses the pseudo-differential delay cell of FIG. 11 or FIG. 12. For clarity of illustration, the individual components of the delay cells 108a-n, 208a-n are not labelled, however the components of each delay cell 108a-n, 208a-n has the same structure and function as those described above in relation to the delay cell 108a-n, 208a-n of FIG. 11 or 12 as appropriate.

The N delay cells 108a-n, 208a-n are arranged in series such that the negative and positive outputs of each delay cell 108a-(n−1), 208a-(n−1) are connected to the positive and negative inputs of the next delay cell 108b-n, 208b-n in the chain. The differential output—i.e. the difference between the negative outputs ph1, ph2, . . . , phn and positive outputs $\overline{ph1}$, $\overline{ph2}$, . . . , $\overline{phn}$—of each delay cell stage 108a-n, 208a-n is a time-delayed version of the differential input to that delay cell stage 108a-n, 208a-n.

By varying the value of the two control voltages vbgp, vbgn, the time delay introduced by each delay cell 108a-n, 208a-n is varied, and thus the total propagation delay of the delay line 112 is also varied.

FIGS. 15A and 15B are circuit diagrams ring oscillators 112, 112' that use the pseudo-differential delay cells 108, 208 of FIG. 11 or FIG. 12 with an odd and even number of cells respectively. It will be appreciated that, like the ring oscillators of FIGS. 6A and 6B, the number N of stages may be selected as appropriate, where an odd number N of cells may be used as per the topology of FIG. 14A, and an even number N of cells may be used as per the topology of FIG. 14B, as outlined below.

As can be seen in FIG. 14A, the ring oscillator 114 is constructed from an odd number N of the delay cells 108a, 108b, . . . , 108n of FIG. 11, or delay cells 208a, 208b, . . . , 208n of FIG. 12, arranged in series, in a loop. For clarity of illustration, the individual components of the delay cells 108a-n, 208a-n are not labelled, however the components of each delay cell 108a-n, 208a-n has the same structure and function as those described above in relation to the delay cells 108, 208 of FIGS. 11 and 12 as appropriate.

In the ring oscillator 114 with an odd number of cells shown in FIG. 15A, the output of the 'last' delay cell 108n, 208n is connected back to the input of the 'first' delay cell 108a, 208a. It will of course be appreciated that the terms 'first' and 'last' are used to provide contrast to the delay cells in the delay line 112, as there is no 'first' or 'last' delay cell by virtue of it being a loop. The inverting output of each delay cell stage 108a-n, 208a-n is connected to the non-inverting input of the next delay cell stage 108a-n, 208a-n in the loop. Similarly, the non-inverting output of each delay cell stage 108a-n, 208a-n is connected to the inverting input of the next delay cell stage 108a-n, 208a-n in the loop Conversely, the ring oscillator 114' of FIG. 15B uses an even number N of delay cells 108a-n, 208a-n arranged in series, in a loop. In this arrangement, the inverting output of all but the last delay cell stage 108a-(n−1), 208a-(n−1) is connected to the non-inverting input of the next delay cell stage 108b-n, 208b-n in the loop; and the non-inverting output of all but the last delay cell stage 108a-(n−1), 208a-(n−1) is connected to the inverting input of the next delay cell stage 108b-n, 208b-n in the loop.

However, when using an even number N of delay cells 108a-n, 208a-n, the inverting and non-inverting outputs of one of the delay cells are 'crossed over' so that they are connected to inverting and non-inverting inputs respectively (rather than to their opposite type as in the rest of the cases). In this example, the inverting and non-inverting outputs of the 'last' delay cell stage 108n, 208n are respectively connected to the inverting and non-inverting outputs of the first delay cell stage 108a, 208a. It will, of course, be appreciated that the term 'last' is arbitrary in a loop structure, and any selected one of the even number N of delay cells 108a-n, 208a-n may have its outputs 'crossed over' in this way.

The loops of these ring oscillators 114, 114' are 'unstable' and, assuming a sufficiently high gain for each stage, the output of each delay cell stage 108a-n, 208a-n alternates between a high value and a low value, providing a substantially square waveform at each output.

By varying the value of the two control voltages vbgp, vbgn, the time delay introduced by each delay cell 108a-n, 208a-n is varied, and thus the frequency of the ring oscillator 114, 114' is also varied.

Thus it will be appreciated by those skilled in the art that embodiments of the present invention provide improved time delay circuits, including delay line and ring oscillator circuits, where linear control of the time delay is provided through a voltage applied to the back-gate of a suitable transistor (including but not limited to a UTBB-FDSOI transistor).

Those skilled in the art will appreciate that the specific embodiments described herein are merely exemplary and that many variants within the scope of the invention are envisaged.

The invention claimed is:

1. A time delay circuit comprising a plurality of differential delay cells each having a respective time delay and being arranged in series, wherein each delay cell comprises:
first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
wherein the back-gate terminal of the PMOS transistor in each inverter sub-cell is connected to the drain node of the other sub-cell; and
wherein a control signal varies the time delay of the delay cell by adjusting a voltage supplied to a back-gate terminal of the NMOS transistor in each inverter sub-cell.

2. The time delay circuit as claimed in claim 1, wherein the transistors comprise ultra-thin body and buried oxide fully depleted silicon-on-insulator (UTBB-FDSOI) transistors.

3. The time delay circuit as claimed in claim 1, comprising a delay line circuit.

4. The time delay circuit as claimed in claim 1, comprising a ring oscillator circuit comprising a plurality of differential delay cells arranged in a ring, each having a positive input, a negative input, a positive output, and a negative output, wherein the positive output of each differential delay cell is connected to the negative input of the next differential delay cell in the ring.

5. A time delay circuit comprising a plurality of differential delay cells each having a respective time delay and being arranged in series, wherein each delay cell comprises:
first and second inverter sub-cells, each of said inverter sub-cells comprising a respective PMOS transistor and an NMOS transistor arranged in series such that their respective drain terminals are connected at a drain node, wherein each of said transistors has a back-gate terminal and is arranged such that a respective threshold voltage of said transistor is linearly dependent on a respective voltage applied to the back-gate terminal of said transistor;
wherein the back-gate terminal of the NMOS transistor in each inverter sub-cell is connected to the drain node of the other sub-cell; and
wherein a control signal varies the time delay of the delay cell by adjusting a voltage supplied to the back-gate terminal of the PMOS transistor in each inverter sub-cell.

6. A time delay circuit comprising a plurality of differential delay cells each having a respective time delay and being arranged in series, wherein each delay cell comprises:
first and second inverter sub-cells, each of said inverter sub-cells comprising a respective PMOS transistor and an NMOS transistor arranged in series such that their respective drain terminals are connected at a drain node; and
a frequency control portion comprising first and second frequency control sub-cells, wherein each of said frequency control sub-cells comprises a respective PMOS transistor and an NMOS transistor;
wherein each of said PMOS and NMOS transistors in each inverter sub-cell and in each frequency control sub-cell has a back-gate terminal and is arranged such that a respective threshold voltage of said transistor is linearly dependent on a respective voltage applied to the back-gate terminal of said transistor;
wherein the back-gate terminal of each of the PMOS and NMOS transistors in each inverter sub-cell is connected to the drain node of the other sub-cell; and
wherein the frequency control portion is arranged such that first and second control signals vary the time delay of the delay cell, wherein the first control signal adjusts a respective voltage at the back-gate terminals of the PMOS transistors in the first and second frequency control sub-cells, and wherein the second control signal adjusts a respective voltage at the back-gate terminals of the NMOS transistors in the first and second frequency control sub-cells;
wherein the respective PMOS and NMOS transistors in each of the first and second frequency control sub-cells are arranged in series such that their respective drain terminals are connected at a drain node;
wherein the drain node of the first inverter sub-cell is connected to the drain node of the first frequency control sub-cell, and wherein the drain node of the second inverter sub-cell is connected to the drain node of the second frequency control sub-cell; and
wherein the gate terminals of the PMOS and NMOS transistors of the first inverter and first frequency control sub-cells are connected together, and wherein the gate terminals of the PMOS and NMOS transistors of the second inverter and second frequency control sub-cells are connected together.

7. A time delay circuit comprising a plurality of differential delay cells each having a respective time delay and being arranged in series, wherein each delay cell comprises:
first and second inverter sub-cells, each of said inverter sub-cells comprising a respective PMOS transistor and an NMOS transistor arranged in series such that their respective drain terminals are connected at a drain node; and
a frequency control portion comprising first and second frequency control sub-cells, wherein each of said frequency control sub-cells comprises a respective PMOS transistor and an NMOS transistor;
wherein each of said PMOS and NMOS transistors in each inverter sub-cell and in each frequency control sub-cell has a back-gate terminal and is arranged such that a respective threshold voltage of said transistor is linearly dependent on a respective voltage applied to the back-gate terminal of said transistor;

wherein the back-gate terminal of each of the PMOS and NMOS transistors in each inverter sub-cell is connected to the drain node of the other sub-cell; and wherein the frequency control portion is arranged such that:

first and second control signals vary the time delay of the delay cell, wherein the first control signal adjusts a respective voltage at the back-gate terminals of the PMOS transistors in the first and second frequency control sub-cells, and wherein the second control signal adjusts a respective voltage at the back-gate terminals of the NMOS transistors in the first and second frequency control sub-cells;

the PMOS transistor of the first frequency control sub-cell has its drain terminal connected to the source terminal of the PMOS transistor of the first inverter sub-cell;

the NMOS transistor of the first frequency control sub-cell has its drain terminal connected to the source terminal of the NMOS transistor of the first inverter sub-cell;

the PMOS transistor of the second frequency control sub-cell has its drain terminal connected to the source terminal of the PMOS transistor of the second inverter sub-cell; and the NMOS transistor of the second frequency control sub-cell has its drain terminal connected to the source terminal of the NMOS transistor of the second inverter sub-cell;

wherein the gate terminals of the PMOS and NMOS transistors of the first frequency control sub-cell are connected to the gate terminals of the PMOS and NMOS transistors of the first inverter sub-cell; and wherein the gate terminals of the PMOS and NMOS transistors of the second frequency control sub-cell are connected to the gate terminals of the PMOS and NMOS transistors of the second inverter sub-cell.

* * * * *